United States Patent
Oishi et al.

(10) Patent No.: US 8,717,795 B2
(45) Date of Patent: May 6, 2014

(54) SEMICONDUCTOR DEVICE HAVING PLURAL CIRCUIT BLOCKS OPERATING AT THE SAME TIMING

(75) Inventors: Hayato Oishi, Tokyo (JP); Hisayuki Nagamine, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 83 days.

(21) Appl. No.: 13/565,666

(22) Filed: Aug. 2, 2012

(65) Prior Publication Data

US 2013/0033916 A1    Feb. 7, 2013

(30) Foreign Application Priority Data

Aug. 5, 2011    (JP) .................................. 2011-171652

(51) Int. Cl.
*G11C 5/02*    (2006.01)
(52) U.S. Cl.
USPC ........ 365/51; 365/63; 365/233.19; 365/233.1
(58) Field of Classification Search
USPC .................. 365/51, 72, 63, 233.19, 233.1
See application file for complete search history.

(56) References Cited

U.S. PATENT DOCUMENTS

| 5,781,049 | A | * | 7/1998 | Fugo | 327/166 |
| 6,225,824 | B1 | * | 5/2001 | Madhu et al. | 326/58 |
| 2011/0058401 | A1 | | 3/2011 | Dono et al. | |

FOREIGN PATENT DOCUMENTS

JP    2011 060909    3/2011

* cited by examiner

*Primary Examiner* — Andrew Q Tran
(74) *Attorney, Agent, or Firm* — McGinn IP Law Group, PLLC

(57) ABSTRACT

Disclosed herein is a device that includes first and second ports arranged in a first direction and first and second circuits arranged between the first and second ports. The first and second ports are coupled to the first and second circuits, respectively. The first and second circuits include first and second sub circuits that control an operation timing thereof based on a timing signal, respectively. The control signal is transmitted through a control line extending in a second direction. Distances between the control line and the first and second sub circuits in the first direction are the same as each other. A coordinate of the control line in the first direction is different from an intermediate coordinate between coordinates of the first and second ports in the first direction.

20 Claims, 42 Drawing Sheets

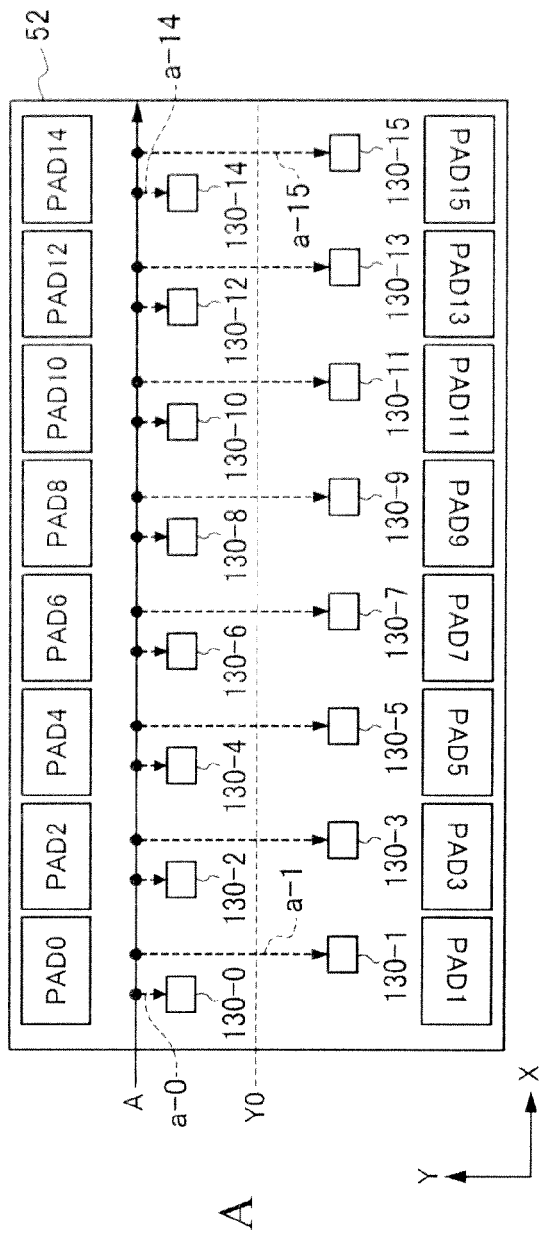
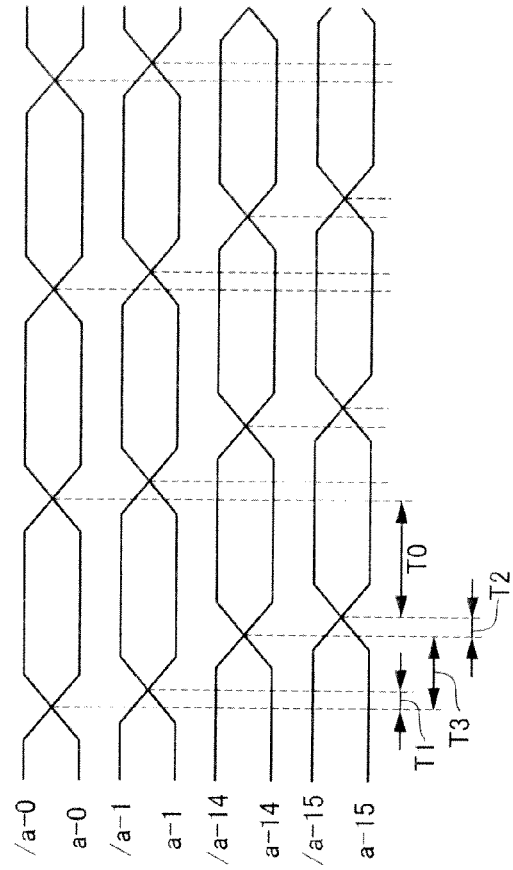
FIG.43A
FIG.43B

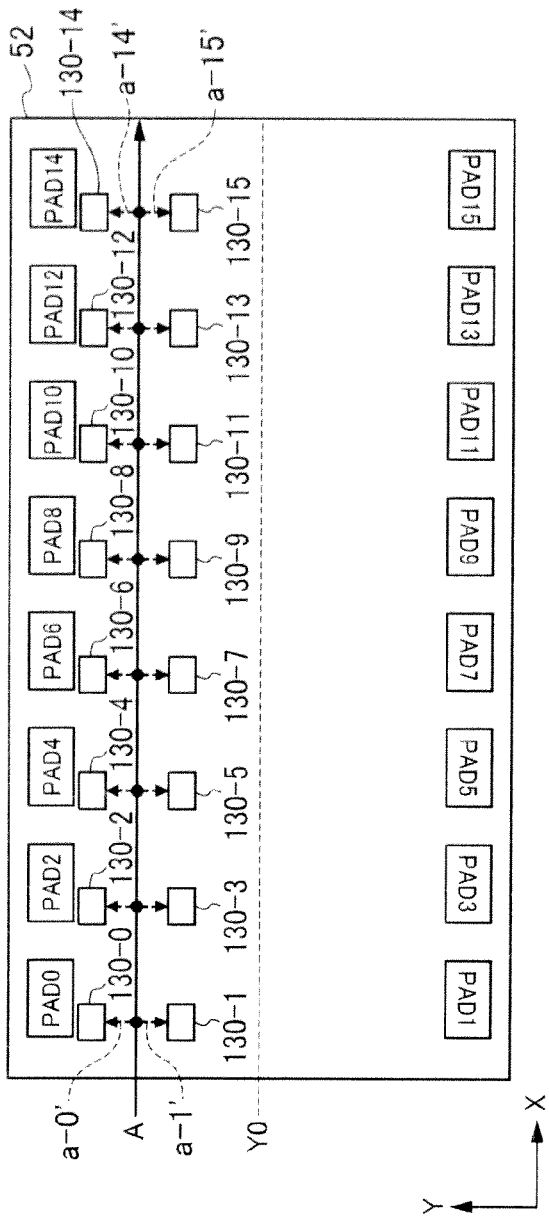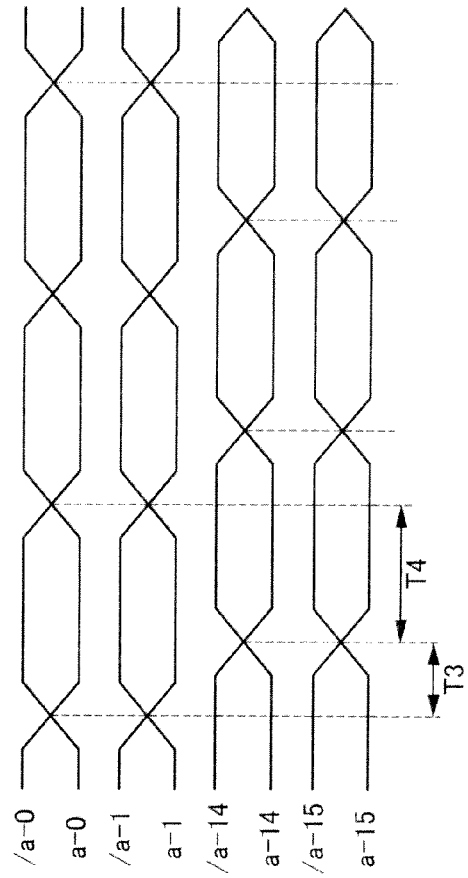
FIG.44A
FIG.44B

SEMICONDUCTOR DEVICE HAVING PLURAL CIRCUIT BLOCKS OPERATING AT THE SAME TIMING

BACKGROUND OF THE INVENTION

1. Field of the Invention

The present invention relates to a semiconductor device, and more particularly to a semiconductor device including a plurality of circuit blocks that need to have exactly the same operation timing.

2. Description of Related Art

Some semiconductor devices include a plurality of circuit blocks that need to have exactly the same operation timing. Among examples of such circuit blocks are data input/output circuits. A data input/output circuit is connected to a data pad or chip pad that is connected to an external terminal of the semiconductor device. Data input/output circuits need to simultaneously supply input data supplied to a plurality of data pads in parallel to an internal circuit, and simultaneously supply output data output from an internal circuit in parallel to the plurality of data pads. For this purpose, a plurality of data input/output circuits need to have exactly the same operation timing.

Some semiconductor devices have a large number of data pads, which are not always possible to arrange in a row. In such a case, data pads may be arranged in two rows, and a plurality of data input/output circuits having the same pattern layout may be arranged between and along the two rows of data pads (see Japanese Patent Application Laid-Open No. 2011-060909). The data input/output circuits assigned to one of the rows of data pads and those assigned to the other row of data pads may be symmetrically arranged with respect to the center line of the two rows of data pads. A timing signal may be supplied to the plurality of data input/output circuits in common.

Now, suppose that data input/output circuits having the same layout are symmetrically arranged as described above. Although a common timing signal is supplied to the plurality of data input/output circuits, the symmetrically-arranged circuits to which the timing signal is supplied may be at a distance from each other. In such a case, wiring for supplying the timing signal to the data input/output circuits assigned to one of the rows of data pads needs to branch off from wiring for supplying the timing signal to the data input/output circuits assigned to the other row of data pads. The branches have different time constants depending on the wiring length. Consequently, the data input/output circuits can vary in operation timing due to the differences in wiring length. If there is a large difference in operation timing, design needs to be tailored to a data input/output circuit that operates the slowest. This causes a hindrance to high speed operations. The branched wiring also increases the load of the timing signal itself, which hinders speedup.

SUMMARY

In one embodiment, there is provided a semiconductor device that includes: first and second ports arranged in a first direction; first and second data lines extending in a second direction that is substantially orthogonal to the first direction between the first and second ports; a first circuit arranged between the first and second ports and including a plurality of sub circuits connected in series between the first port and the first data line, the plurality of sub circuits of the first circuit including at least a first sub circuit; a second circuit arranged between the first and second ports and including a plurality of sub circuits connected in series between the second port and the second data line, the plurality of sub circuits of the second circuit including at least a second sub circuit; a control line extending in the second direction between the first and second ports and transmitting a timing signal to control the first and second sub circuits in common; a first branch line branched from the control line and extending in the first direction to supply the timing signal to the first sub circuit; and a second branch line branched from the control line and extending in the first direction to supply the timing signal to the second sub circuit. A first coordinate that is an intermediate coordinate between the first and second sub circuits in the first direction is different from a second coordinate that is an intermediate coordinate between the first and second ports in the first direction. The first and second branch lines have substantially the same length in the first direction.

In another embodiment, there is provided a semiconductor device that includes: first and second ports arranged in a first direction; a first circuit that controls a first signal transmitted through the first port; a second circuit that controls a second signal transmitted through the second port; and first and second control lines extending in a second direction substantially orthogonal to the first direction between the first and second ports. The first circuit includes first and second timing control circuits that control transmission timing of the first signal, and the second circuit includes third and fourth timing control circuits that control transmission timing of the second signal. The first and third timing control circuits operate in synchronism with a first timing signal supplied through the first control line, and the second and fourth timing control circuits operate in synchronism with a second timing signal supplied through the second control line. A first coordinate that is an intermediate coordinate between the first and third timing control circuits in the first direction is different from a second coordinate that is an intermediate coordinate between the second and fourth timing control circuits in the first direction.

In still another embodiment, there is provided a semiconductor device that includes: first and second ports arranged in a first direction; a first circuit including a first output circuit that outputs a first output data to the first port and a first input circuit that receives a first input data supplied from the first port; a second circuit including a second output circuit that outputs a second output data to the second port and a second input circuit that receives a second input data supplied from the second port; a first data line extending in a second direction substantially orthogonal to the first direction between the first and second ports, the first data line transmitting the first input data and the first output data; and a second data line extending in the second direction between the first and second ports, the second data line transmitting the second input data and the second output data. The first output circuit, the first input circuit and the first data line are arranged on a first coordinate in the first direction, and the second output circuit, the second input circuit and the second data line are arranged on a second coordinate in the first direction. A coordinate that equally divides the first and second coordinates in the first direction is different from a coordinate that equally divides the first and second ports in the first direction.

BRIEF DESCRIPTION OF THE DRAWINGS

FIG. 43A shows a layout according to a prototype in the course of making the present invention;

FIG. 43B shows the waveforms of the timing signal A input to the write data latch circuits 130 according to the prototype;

FIG. 44A shows a layout according to the embodiment of the present invention;

FIG. 44B shows the waveforms of the timing signal A input to the write data latch circuits 130 according to the embodiment;

DETAILED DESCRIPTION OF THE EMBODIMENTS

Figure 1:
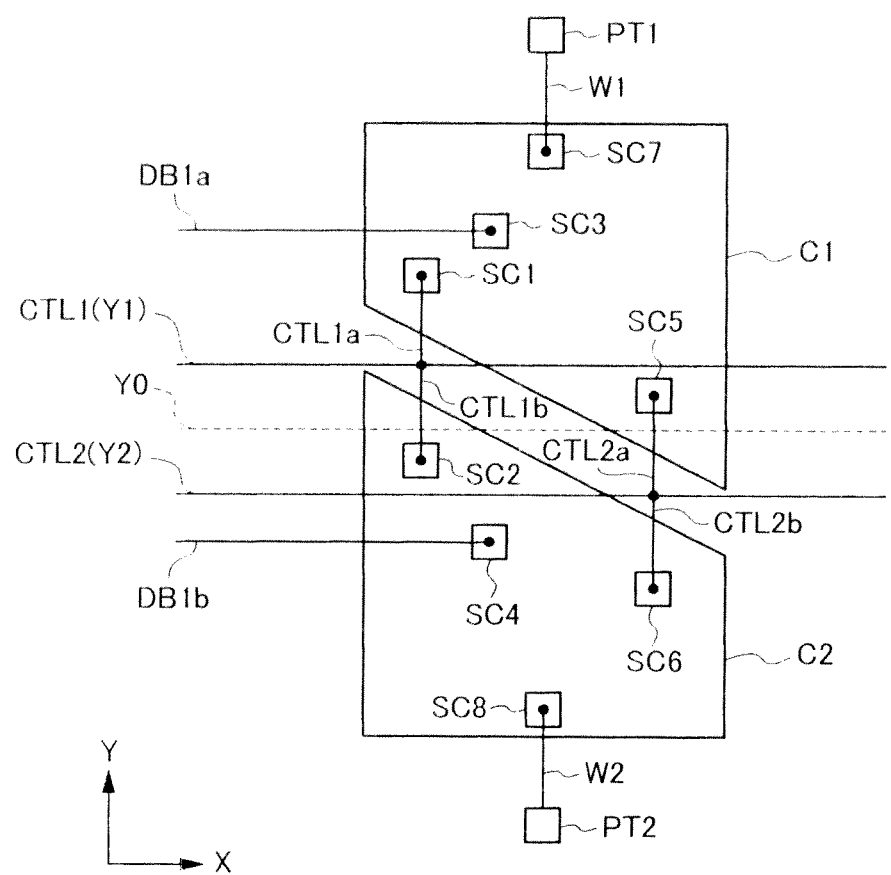
FIG. 1 shows an embodiment of the present invention.

Referring now to FIG. 1, first and second ports PT1 and PT2 are arranged in a Y direction (first direction). First and second circuits C1 and C2 having the same function are arranged between the first and second ports PT1 and PT2. The first and second ports PT1 and PT2 are pad electrodes of a chip included in a semiconductor device, and connected to outside the chip through bonding wires, bumps, through-silicon vias (TSVs), or the like. The first circuit C1 includes a plurality of sub circuits including sub circuits SC1, SC3, SC5, and SC7. The sub circuits are connected in series between the first port PT1 and a first data line DB1a. Similarly, the second circuit C2 includes a plurality of sub circuits including sub circuits SC2, SC4, SC6, and SC8. The sub circuits are connected in series between the second port PT2 and a second data line DB1b.

As shown in FIG. 1, the first and second circuits C1 and C2 do not have an axisymmetric layout with respect to an coordinate Y0 (intermediate coordinate Y0) that is intermediate between and equally divides the first and second ports PT1 and PT2 in the Y direction. Instead, some of the sub circuits are axisymmetrically laid out with respect to corresponding control lines. Specifically, the sub circuits SC1 and SC2 have the same circuit configuration. The sub circuits SC1 and SC2 control the operation timing of the first and second circuits C1 and C2, respectively. The operation timing of both the first and second circuits C1 and C2 is in synchronization with a timing signal supplied through a common control line CTL1. The control line CTL1 is a common line that is arranged to extend in an X direction (second direction). A coordinate Y1 (intermediate coordinate Y1) intermediate in the Y direction between where the sub circuits SC1 and SC2 are arranged is not relevant to the foregoing intermediate coordinate Y0 but is relevant to (preferably coincides with) the Y coordinate of the control line CTL1. The resulting branch lines CLT1a and CLT1b from the control line CTL1 have almost the same wiring lengths. Consequently, the timing signal supplied through the control line CTL1 is almost simultaneously supplied to the input nodes of the respective sub circuits SC1 and SC2. As employed herein, coordinate intermediate between A and B may be referred to simply as an "intermediate coordinate."

Similarly, the sub circuits SC5 and SC6, different from the sub circuits SC1 and SC2, are sub circuits having the same circuit configuration. The sub circuits SC5 and SC6 control the operation timing of the first and second circuits C1 and C2, respectively. The operation timing of both the first and second circuits C1 and C2 is in synchronization with a timing signal supplied through a common control line CTL2. The control line CTL2 is a common line that is arranged to extend in the X direction. An intermediate coordinate Y2 in the Y direction between where the sub circuits SC5 and SC6 are arranged is not relevant to the foregoing intermediate coordinate Y0 but is relevant to (preferably coincides with) the Y coordinate of the control line CTL2. The resulting branch lines CLT2a and CLT2b from the control line CTL2 have almost the same wiring lengths. Consequently, the timing signal supplied through the control line CTL2 is almost simultaneously supplied to the input nodes of the respective sub circuits SC5 and SC6.

The sub circuit SC3 included in the first circuit C1 is a circuit that transmits or receives data through the first data line DB1a, i.e., a circuit that directly transmits and/or receives data to/from the first data line DB1a. The sub circuit SC7 included in the first circuit C1 is a circuit that transmits or receives data through the first port PT1, i.e., a circuit that directly transmits and/or receives data to/from the first port PT1. The sub circuit SC3 is positioned at one end of the plurality of sub circuits connected in series. The sub circuit SC7 is positioned at the other end of the plurality of sub circuits connected in series. The foregoing sub circuits SC1 and SC5 are connected between the sub circuits SC3 and SC7. Since the Y coordinate where the sub circuit SC3 is arranged is relevant to (preferably coincides with) the Y coordinate of the corresponding first data line DB1a, the first data line DB1a need not be bent in the Y direction. The sub circuit SC3 and the first data line DB1a can thus be connected in the shortest distance, and can transmit and receive corresponding data in an environment free of a parasitic time constant. In addition, the sub circuit SC7 is arranged in the closest vicinity to the first port PT1 among the plurality of sub circuits. The sub circuit SC7 and the first port PT1 can thus be connected by a line W1 of the smallest wiring length.

Similarly, the sub circuit SC4 included in the second circuit C2 is a circuit that transmits or receives data through the second data line DB1b, i.e., a circuit that directly transmits and/or receives data to/from the second data line DB1b. The sub circuit SC8 included in the second circuit C2 is a circuit that transmits or receives data through the second port PT2, i.e., a circuit that directly transmits and/or receives data to/from the second port PT2. The sub circuit SC4 is positioned at one end of the plurality of sub circuits connected in series. The sub circuit SC8 is positioned at the other end of the plurality of sub circuits connected in series. The foregoing sub circuits SC2 and SC6 are connected between the sub circuits SC4 and SC8. Since the Y coordinate where the sub circuit SC4 is arranged is relevant to (preferably coincides with) the Y coordinate of the corresponding second data line DB1b, the second data line DB1b need not be bent in the Y direction. The sub circuit SC4 and the second data line DB1b can be connected in the shortest distance, and can transmit and receive corresponding data in an environment free of a parasitic time constant. Moreover, the sub circuit SC8 is arranged in the closest vicinity to the second port PT2 among the plurality of sub circuits. The sub circuit SC8 and the second port PT2 can thus be connected by a line W2 of the smallest wiring length.

The other sub circuits included in the first and second circuits C1 and C2 are laid out in the remaining areas in association with the intermediate coordinate Y0. Wiring distances between the sub circuits can differ slightly in the first circuit C1 and the second circuit C2, whereas the resulting characteristic differences can be resolved by adjusting the ability of transistors and the capacitive components and resistive components of lines in a design phase. It should be noted that the other sub circuits refer to circuits that communicate with prior and subsequent circuits but will not be subjected to operation timing control from other circuits unlike the sub circuits SC1, SC2, SC5, and SC6. In other words, the other sub circuits are circuits that are completed within the first circuit C1 and the second circuit C2. The operation timing control is effected, for example, by a signal that is relevant to a synchronization signal for controlling the semiconductor device.

More detailed embodiments of the present invention will be explained below with reference to the accompanying drawings.

Figure 2:
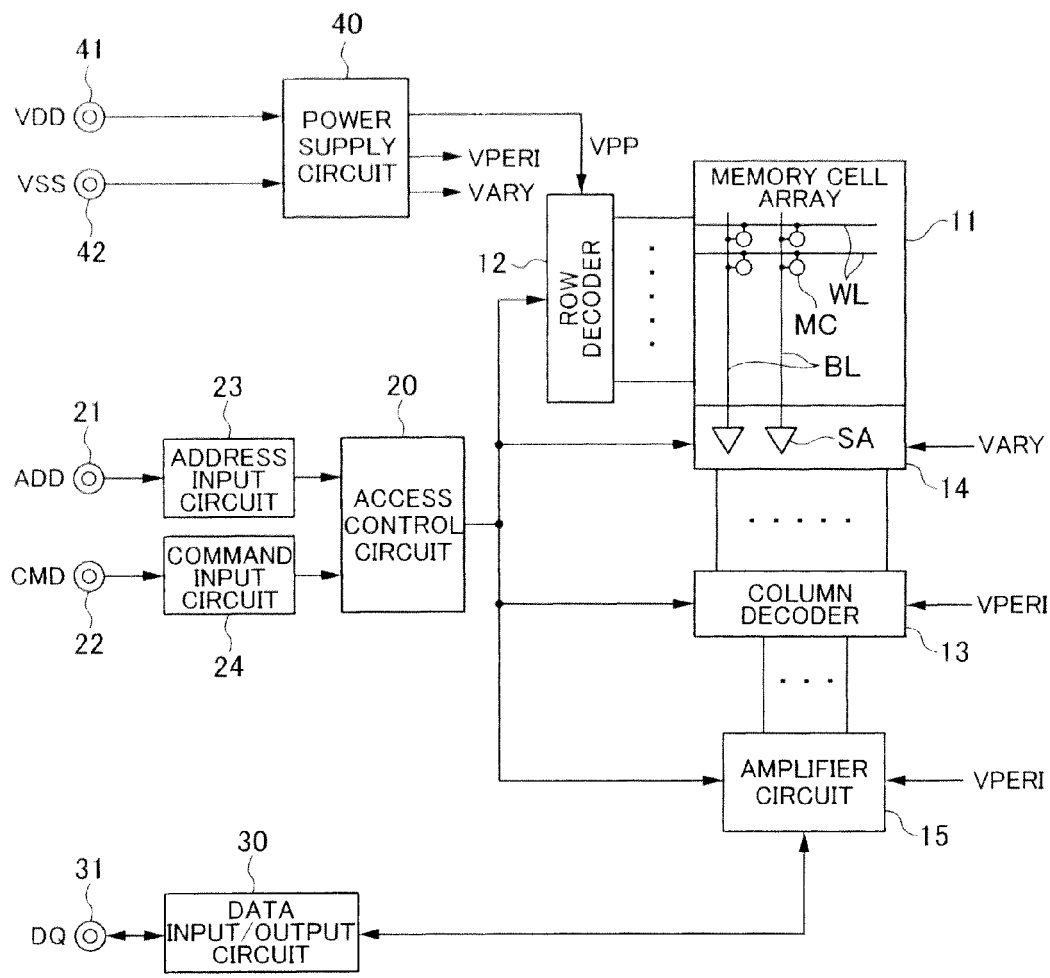
FIG. 2 is a block diagram showing the overall configuration of a semiconductor device according to an embodiment of the present invention.

Turning to FIG. 2, the semiconductor device 10 according to the embodiment of the present invention is a DRAM (Dynamic Random Access Memory). As shown in FIG. 2, the semiconductor device 10 includes a memory cell array 11. The memory cell array 11 includes a plurality of word lines WL and a plurality of bit lines BL which intersect each other. Memory cells MC are arranged at the intersections of the word lines WL and bit lines BL. The word lines WL are selected by a row decoder 12. The bit lines BL are selected by a column decoder 13. The bit lines BL are connected to respective corresponding sense amplifiers SA in a sense circuit 14. Bit lines BL selected by the column decoder 13 are connected to an amplifier circuit 15 through sense amplifiers SA.

The operation of the row decoder 12, the column decoder 13, the sense circuit 14, and the amplifier circuit 15 is controlled by an access control circuit 20. An address signal ADD is supplied to the access control circuit 20 from outside through an address terminal 21 and an address input circuit 23. A command signal CMD is supplied to the access control circuit 20 from outside through a command terminal 22 and a command input circuit 24. The address input circuit 23 functions to receive and amplify the address signal ADD supplied to the address terminal 21. Similarly, the command input circuit 24 functions to receive and amplify the command signal CMD supplied to the command terminal 22. The access control circuit 20 controls the row decoder 12, the column decoder 13, the sense circuit 14, and the amplifier circuit 15 based on the address signal ADD and the command signal CMD.

Specifically, when the command signal CMD indicates an active operation of the semiconductor device 10, the address signal ADD is supplied to the row decoder 12. The row decoder 12 selects a word line WL that is designated by the address signal ADD, whereby corresponding memory cells MC are connected to respective bit lines BL. The access control circuit 20 then activates the sense circuit 14 at predetermined timing.

Now, when the command signal CMD indicates a read operation or write operation of the semiconductor device 10, the address signal ADD is supplied to the column decoder 13. The column decoder 13 connects bit lines BL designated by the address signal ADD to the amplifier circuit 15. Consequently, in a read operation, read data DQ read from the memory cell array 11 through sense amplifiers SA is output from a data terminal 31 to outside through the amplifier circuit 15 and a data input/output circuit 30. In a write operation, write data DQ supplied from outside through the data terminal 31 and the data input/output circuit 30 is written to memory cells MC through the amplifier circuit 15 and sense amplifiers SA.

The foregoing circuit blocks each operate with a predetermined internal voltage as a power supply. Such internal power supplies are generated by a power supply circuit 40 shown in FIG. 2. The power supply circuit 40 receives an external potential VDD and a ground potential VSS supplied through power supply terminals 41 and 42, respectively. Based on the potentials, the power supply circuit 40 generates internal voltages VPP, VPERI, VARY, etc. The internal potential VPP is generated by boosting the external potential VDD. The internal potentials VPERI and VARY are generated by stepping down the external potential VDD.

The internal voltage VPP is a voltage that is mainly used in the row decoder 12. The row decoder 12 drives a word line WL that is selected based on the address signal ADD to the VPP level, thereby making cell transistors included in the memory cells MC conducting. The internal voltage VARY is a voltage that is mainly used in the sense circuit 14. The sense circuit 14, when activated, drives either one of each pair of bit lines to the VARY level and the other to the VSS level, thereby amplifying read data that are read out from the selected memory cells. The internal voltage VPERI is used as the operating voltage of most of the peripheral circuits such as the access control circuit 20. The use of the internal voltage VPERI lower than the external voltage VDD as the operating voltage of the peripheral circuits reduces the power consumption of the semiconductor device 10.

Figure 3:
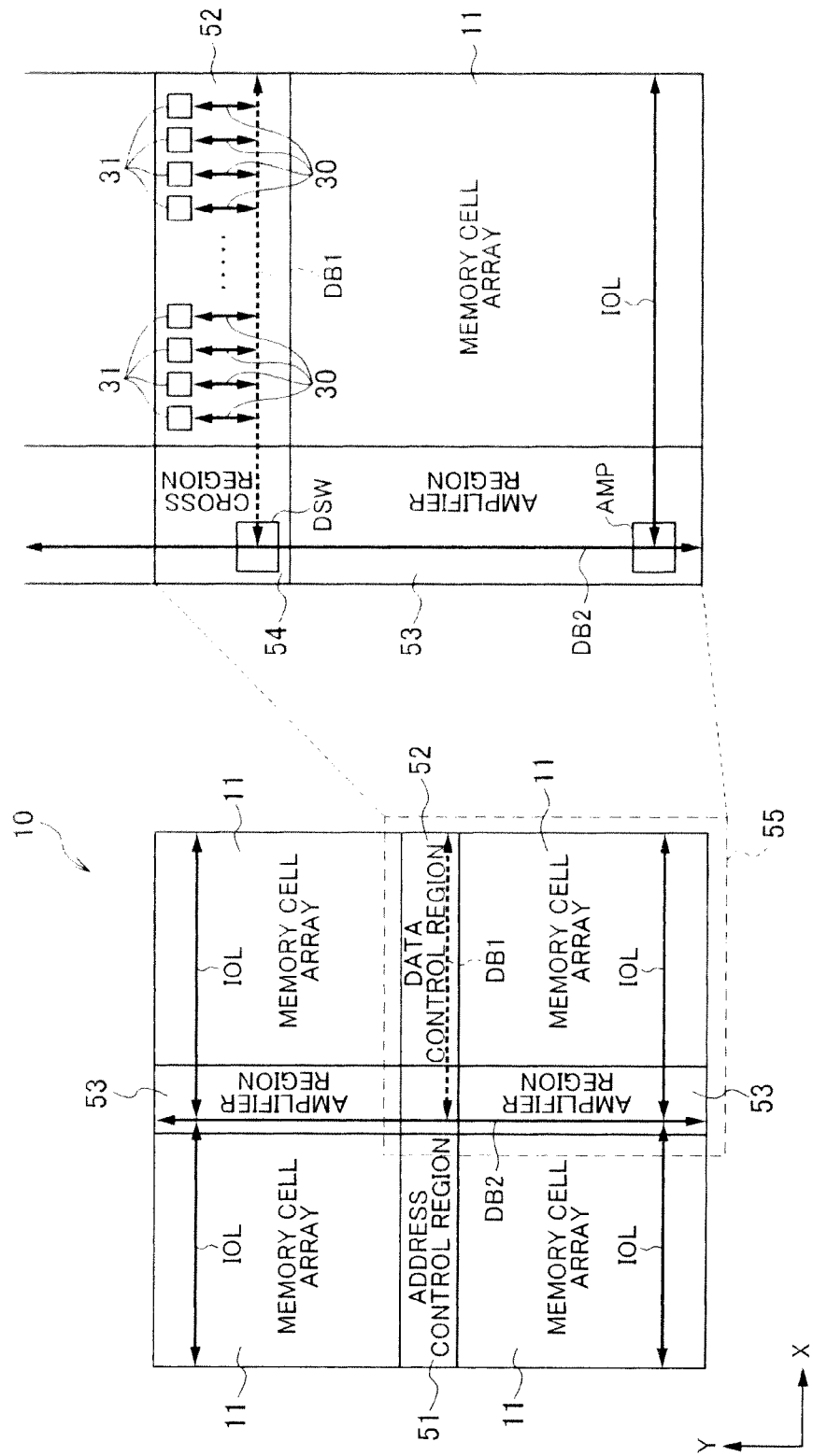
FIG. 3A is a schematic plan view showing the entire layout of the semiconductor device shown in FIG. 2.
FIG. 3B is an enlarged view of an area 55 shown in FIG. 3A.

Turning to FIG. 3A, the memory cell array 11 of the semiconductor device 10 according to the present embodiment is divided into four, which are arranged in a matrix configuration. An address control region 51 and a data control region 52 are arranged between two memory cell arrays 11 adjoining in the Y direction. An amplifier region 53 is arranged between two memory cell arrays 11 adjoining in the X direction. The address control region 51 or the data control region 52 is a region where various types of circuit blocks belonging to so-called peripheral circuits are arranged. The address control region 51 mainly includes the access control circuit 20, the address terminal 21, the command terminal 22, the address input circuit 23, and the command input circuit 24 shown in FIG. 2. The data control region 52 mainly includes the data input/output circuit 30 and the data terminal 31 shown in FIG. 2. The amplifier regions 53 mainly include the amplifier circuit 5 shown in FIG. 2.

I/O lines IOL are arranged to extend in the X direction in the regions where the memory cell arrays 11 are formed. FIG. 3A shows one I/O line IOL for each memory cell array 11. In fact, a large number of I/O lines IOL are arranged to extend in the X direction. A data bus DB2 is arranged to extend in the Y direction over the amplifier regions 53. FIG. 3A shows only one data bus DB2, whereas a large number of data buses DB2 are actually arranged to extend in the Y direction. A data bus DB1 is arranged to extend in the X direction in the data control region 52. FIG. 3A shows only one data bus DB1, whereas a large number of data buses DB1 are actually arranged to extend in the X direction.

As shown in FIG. 3B that is an enlarged view of an area 55 shown in FIG. 3A, the I/O line IOL and the data bus DB2 are connected through a data amplifier AMP which is arranged in the amplifier region 53. The data bus DB2 and the data bus DB1 are connected through a decoding switch DSW which is arranged in a cross region 54. The data bus DB1 is connected to data input/output circuits 30, and is connected to data terminals 31 through the corresponding data input/output circuits 30. FIG. 3B shows the data input/output circuits 30 by double-headed arrows in order to indicate that the data input/output circuits 30 are bidirectional circuits.

With such a configuration, write data input from outside through a plurality of data terminals 31 in parallel is supplied to the memory cell arrays 11 through the data input/output circuits 30, the data bus DB1, the data bus DB2, and the I/O lines IOL. Read data read from the memory cell arrays 11 is output from the plurality of data terminals 31 to outside in parallel through the I/O lines IOL, the data bus DB2, the data bus DB1, and the data input/output circuits 30.

Figure 4:
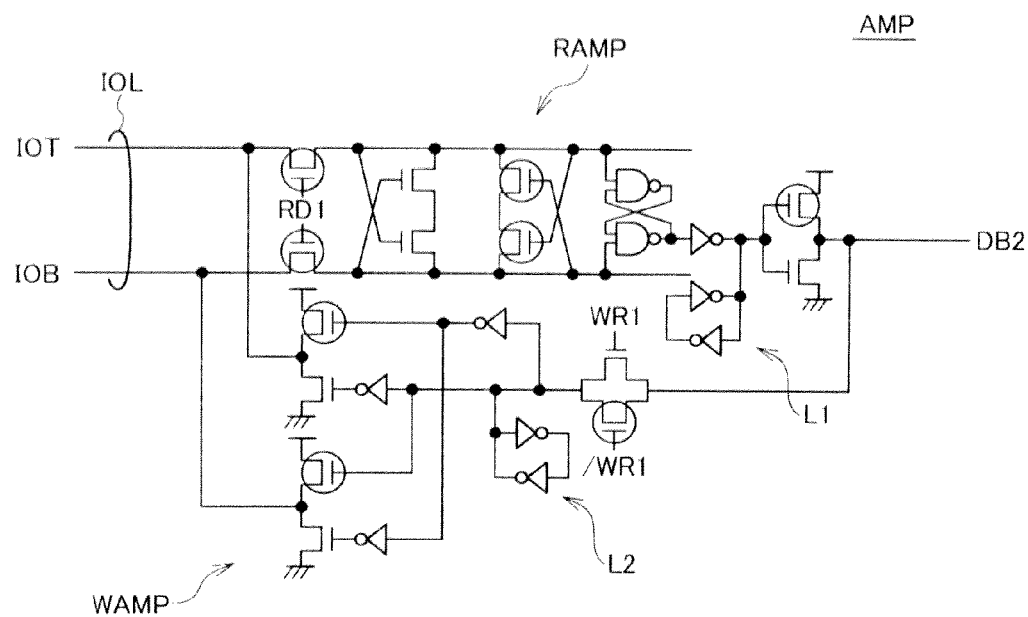
FIG. 4 is a circuit diagram showing an example of the data amplifier shown in FIG. 3B.

Turning to FIG. 4, an I/O line IOL is composed of complementary lines IOT and I/O. In contrast, the data bus DB2 has a line per bit. That is, I/O lines IOL are wiring for transmitting complementary signals while the data bus DB2 is wiring for transmitting a single-ended signal. The data bus DB1 is also wiring for transmitting a single-ended signal.

A data amplifier AMP includes a read amplifier RAMP which is activated in a read operation, and a write amplifier WAMP which is activated in a write operation. The read amplifier RAMP is activated by a read signal RD1. When the read amplifier RAMP is activated, a potential difference between the complementary lines IOT and IOB is amplified and output to the data bus DB2. The write amplifier WAMP is activated by write signals WR1 and /WR1. When the write amplifier WAMP is activated, the signal on the data bus DB2 is supplied to the complementary lines IOT and IOB. It should be appreciated that a signal having a signal name with a leading "/" is either the inverted signal of a corresponding signal or a low-active signal.

As shown in FIG. 4, the read amplifier RAMP includes a latch circuit L1. The write amplifier WAMP includes a latch circuit L2. The read data output from the read amplifier RAMP is retained by the latch circuit L1. The write data to be input to the write amplifier WAMP is retained by the latch circuit L2.

Figure 5:
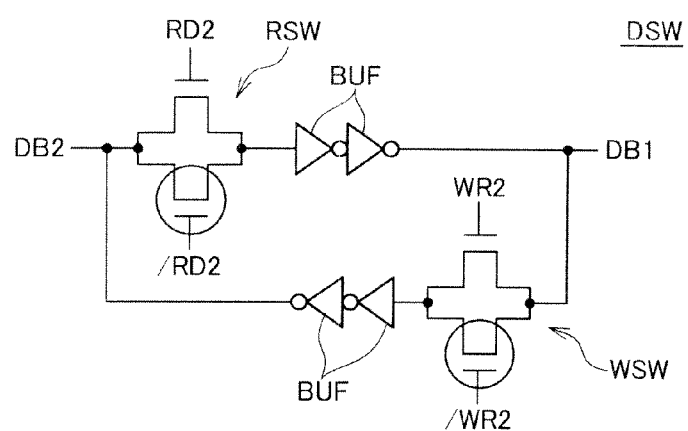
FIG. 5 is a circuit diagram showing an example of the decoding switch shown in FIG. 3B.

Turning to FIG. 5, the decoding switch DSW includes a read switch RSW which is activated by read signals RD2 and /RD2, and a write switch WSW which is activated by write signals WR2 and /WR2. When the read switch RSW is activated, the signal on the data bus DB2 is output to the data bus DB1 through a buffer BUF. When the write switch WSW is activated, the signal on the data bus DB1 is output to the data bus DB2 through a buffer BUF.

As shown in FIG. 5, the decoding switch DSW includes no latch circuit. The read data and write data are not latched but simply switched and buffered by the decoding switch DSW.

Figure 6:
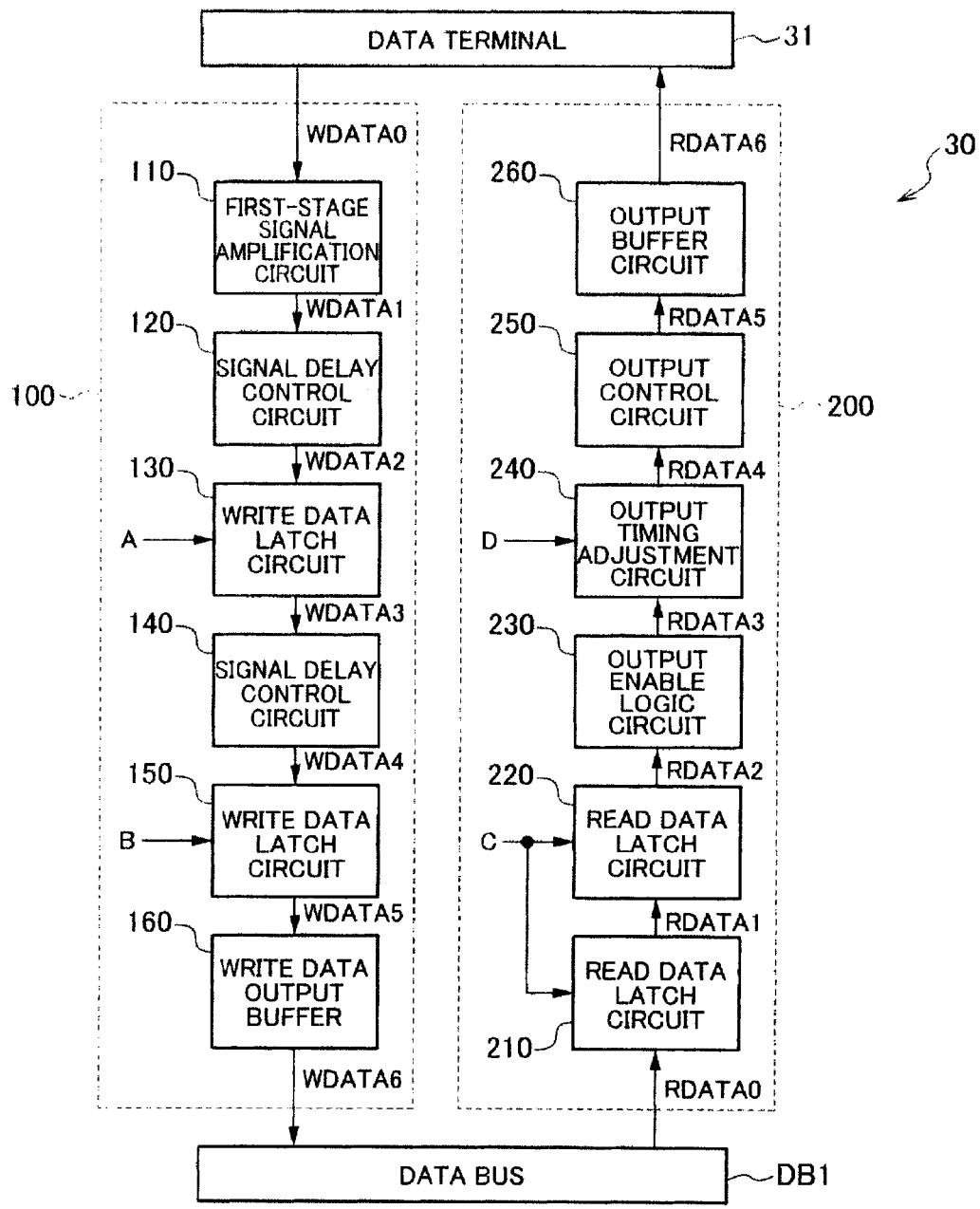
FIG. 6 is a block diagram for explaining the configuration of the data input/output circuits shown in FIG.

Turning to FIG. 6, a data input/output circuit 30 includes a write system circuit block 100 and a read system circuit block 200. The write system circuit block 100 and the read system circuit block 200 are connected in parallel between a corresponding data terminal 31 and the data bus DB1.

The write system circuit block 100 includes a plurality of circuit blocks which are connected in series between the corresponding data terminal 31 and the data bus DB1. Specifically, a first-stage signal amplification circuit 110, a signal delay control circuit 120, a write data latch circuit 130, a signal delay control circuit 140, a write data latch circuit 150, and a write data output buffer 160 are connected in series in that order. In the present embodiment, each of such circuit blocks may sometimes be referred to as a "sub circuit." The circuit blocks from the write data latch circuit 130 up to the write data output buffer 160 constitute a circuit section called a write FIFO circuit. A write FIFO circuit needs exact timing control on write data. Specifically, timing control is performed in synchronization with timing signals A and B supplied to the write data latch circuits 130 and 150.

The read system circuit block 200 includes a plurality of circuit blocks which are connected in series between the corresponding data bus DB1 and the data terminal 31. Specifically, read data latch circuits 210 and 220, an output enable logic circuit 230, an output timing adjustment circuit 240, an output control circuit 250, and an output buffer circuit 260 are connected in series in that order. In the present embodiment, each of such circuit blocks may also be referred to as a "sub circuit." The circuit blocks from the read data latch circuit 210 up to the output timing adjustment circuit 240 constitute a circuit section called a read FIFO circuit. A read FIFO circuit needs exact timing control on read data. Specifically, timing control is performed in synchronization with a timing signal C supplied to the read data latch circuits 210 and 220 and a timing signal D supplied to the output timing adjustment circuit 240.

Figure 7:
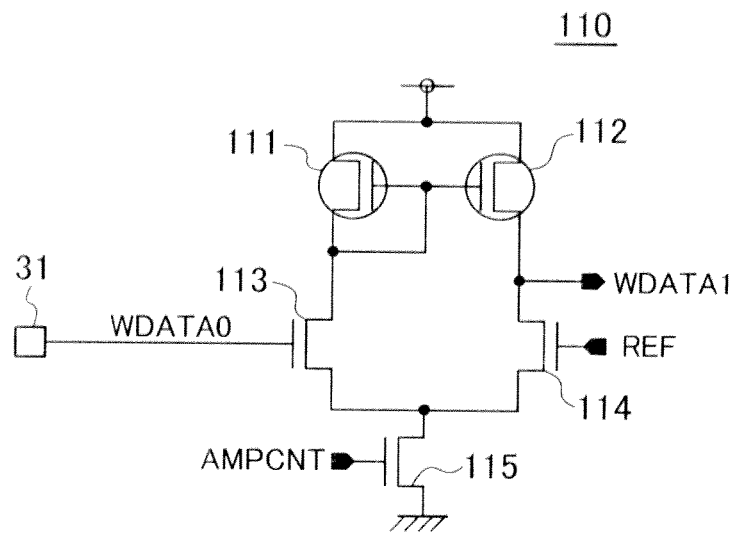
FIG. 7 is a circuit diagram of the first-stage signal amplification circuit shown in FIG. 6.

As shown in FIG. 7, the first-stage signal amplification circuit 110 is a differential amplifier including transistors 111 to 115. Write data WDATA0 supplied from the data terminal 31 is supplied to the gate electrode of the transistor 113. A reference potential REF is supplied to the gate electrode of the transistor 114. The transistors 111 and 112 constitute a current mirror circuit. The first-stage signal amplification circuit 110 is activated by an amplifier control signal AMPCNT supplied to the gate electrode of the transistor 115, and drives write data WDATA1 to predetermined logic level based a potential difference between the write data WDATA0 and the reference potential REF.

Figure 8:
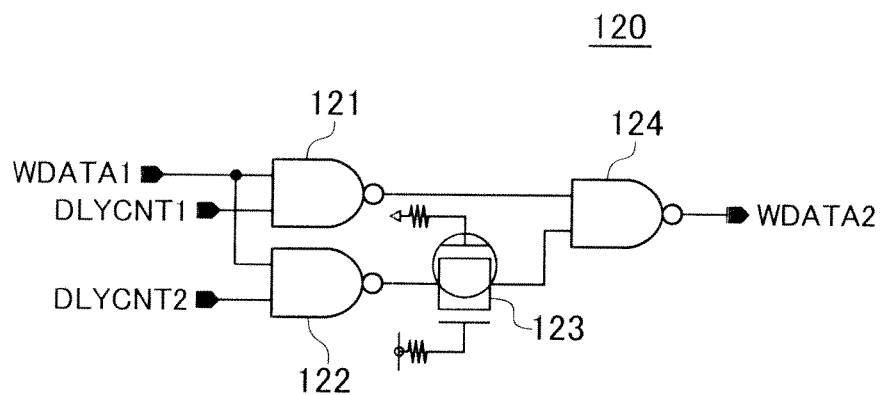
FIG. 8 is a circuit diagram of the signal delay control circuit shown in FIG. 6.

As shown in FIG. 8, the signal delay control circuit 120 includes two NAND gate circuits 121 and 122 to which the write data WDATA1 is supplied. Delay control signals DLYCNT1 and DLYCNT2 are supplied to the NAND gate circuits 121 and 122, respectively, whereby the write data WDATA1 is passed through either one of the NAND gate circuits 121 and 122. The output of the NAND gate circuit 121 is directly supplied to the subsequent NAND gate circuit 124. The output of the NAND gate circuit 122 is supplied to the NAND gate circuit 124 through a delay element 123. The delay element 123 is composed of a transfer gate that is always ON. Consequently, the delay control signal DLYCNT1 can be activated to reduce the amount of delay of write data WDATA2. The delay control signal DLYCNT2 can be activated to increase the amount of delay of the write data WDATA2.

Figure 9:
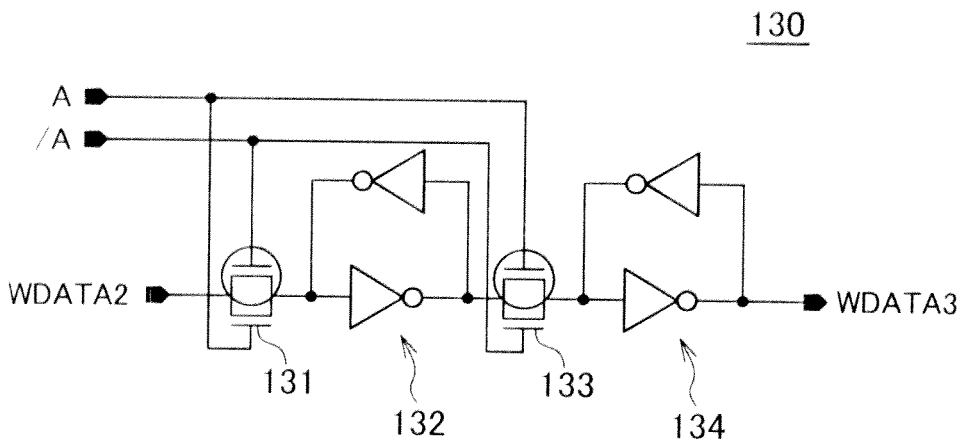
FIG. 9 is a circuit diagram of the write data latch circuit shown in FIG. 6.

As shown in FIG. 9, the write data latch circuit 130 includes two latch circuits 132 and 134 which are connected in series. The write data latch circuit 130 also includes a transfer gate 131. When the timing signal A becomes a high level (a timing signal /A becomes a low level), the write data WDATA2 supplied to the write data latch circuit 130 is latched into the latch circuit 132 through the transfer gate 131. The write data latch circuit 130 further includes a transfer gate 133. When the timing signal A becomes a low level (the timing signal /A becomes a high level), the write data WDATA2 latched by the latch circuit 132 is latched into the latch circuit 134 through the transfer gate 133. The output of the latch circuit 134 is used as write data WDATA3.

Figure 10:
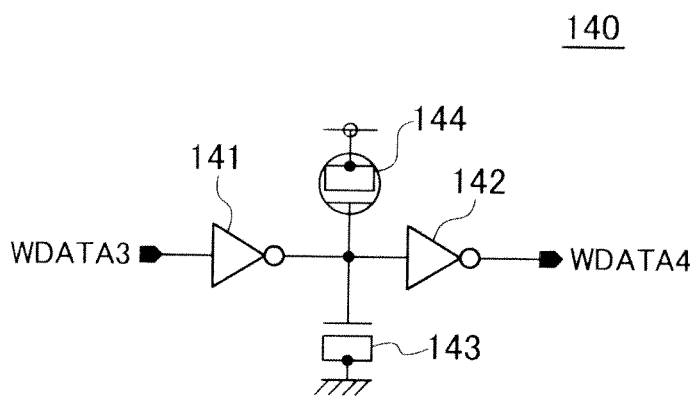
FIG. 10 is a circuit diagram of the signal delay control circuit shown in FIG. 6.

As shown in FIG. 10, the signal delay control circuit 140 includes two inverters 141 and 142 which are connected in series. Capacitive elements 143 and 144 are connected to between the inverters 141 and 142. The capacitive element 143 is an element using the gate capacitance of an N-channel MOS transistor. The capacitive element 144 is an element using the gate capacitance of a P-channel MOS transistor. With such a configuration, the write data WDATA3 supplied to the signal delay control circuit 140 is delayed and output as write data WDATA4. The signal delay control circuit 140 is used to delay write data because the operation timing of the write data latch circuit 130 and the operation timing of the write data latch circuit 150 are different. The signal delay control circuit 140 is intended to adjust the difference in timing.

Figure 11:
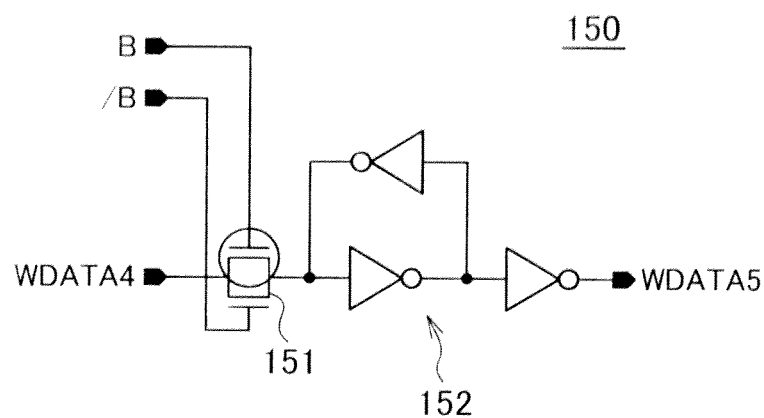
FIG. 11 is a circuit diagram of the write data latch circuit shown in FIG. 6.

As shown in FIG. 11, the write data latch circuit 150 includes a transfer gate 151 and a latch circuit 152. The transfer gate 151 becomes conducting when the timing signal B becomes a low level (a timing signal /B becomes a high level). As a result, the write data WDATA4 is latched into the latch circuit 152 through the transfer gate 151. The output of the latch circuit 152 is used as write data WDATA5.

Figure 12:
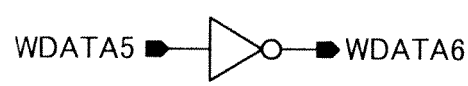
FIG. 12 is a circuit diagram of the write data output buffer shown in FIG. 6.

As shown in FIG. 12, the write data output buffer 160 includes an inverter which receives the write data WDATA5 and outputs write data WDATA6. The inverter normally is considered to be an element belonging to the write data latch circuit 150 shown in FIG. 11. In the present embodiment, the write data latch circuit 150 and the write data output buffer 160 are handled as separate circuits because the position to arrange the write data latch circuit 150 and the position to arrange the write data output buffer 160 are determined by respective different standards. The write data WDATA6 is supplied to the data bus DB1.

The specific circuit configurations of the circuit blocks constituting the write system circuit block 100 have been described above. Next, specific circuit configurations of the circuit blocks constituting the read system circuit block 200 will be described.

Figure 13:
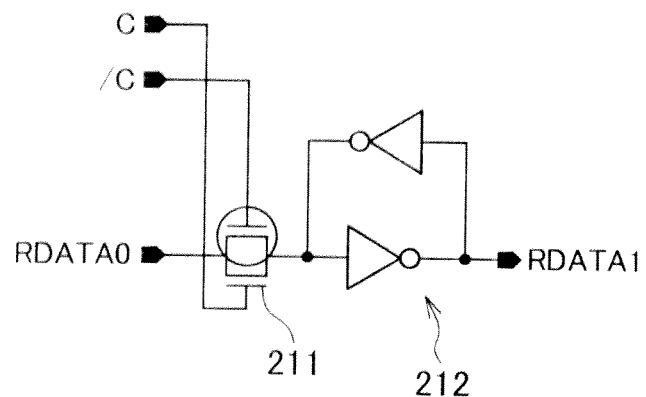
FIG. 13 is a circuit diagram of the read data latch circuit shown in FIG. 6.

As shown in FIG. 13, the read data latch circuit 210 includes a transfer gate 211 and a latch circuit 212. The transfer gate 211 becomes conducting when the timing signal C becomes a high level (a timing signal /C becomes a low level). As a result, read data RDATA0 is latched into the latch circuit 212 through the transfer gate 211. The read data RDATA0 is supplied from the data bus DB1. The output of the latch circuit 212 is used as read data RDATA1.

Figure 14:
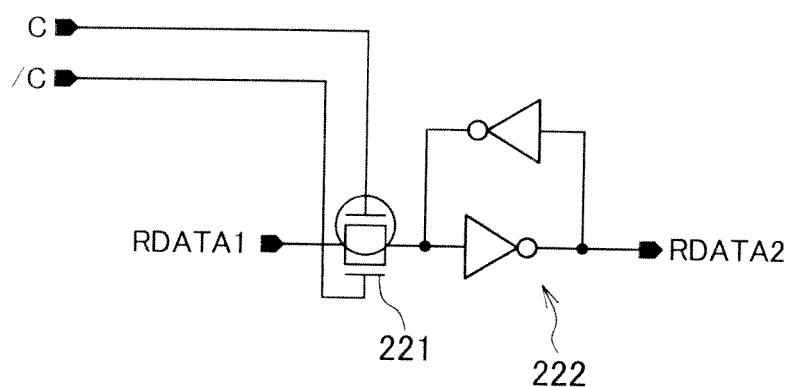
FIG. 14 is a circuit diagram of the read data latch circuit shown in FIG. 6.

As shown in FIG. 14, the read data latch circuit 220 includes a transfer gate 221 and a latch circuit 222. The transfer gate 221 becomes conducting when the timing signal C becomes a low level (the timing signal /C becomes a high level). As a result, the read data RDATA1 is latched into the latch circuit 222 through the transfer gate 221. The output of the latch circuit 222 is used as read data RDATA2. The read data latch circuits 210 and 220 normally constitute a single circuit block. In the present embodiment, the read data latch circuits 210 and 220 are handled as separate circuits because the position to arrange the read data latch circuit 210 and the position to arrange the read data latch circuit 220 are determined by respective different standards.

Figure 15:
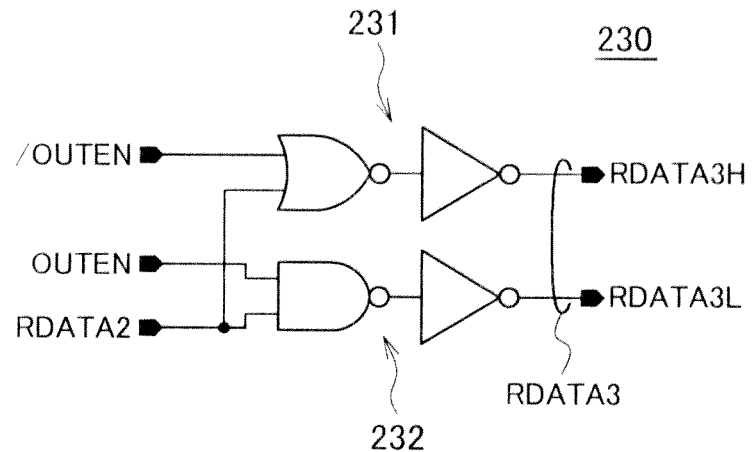
FIG. 15 is a circuit diagram of the output enable logic circuit shown in FIG. 6.

As shown in FIG. 15, the output enable logic circuit 230 includes an OR gate circuit 231 and an AND gate circuit 232 to which the read data RDATA2 is supplied. Enable signals /OUTEN and OUTEN are supplied to the gate circuits 231 and 233, respectively. When the enable signal /OUTEN becomes a low level and the enable signal OUTEN a high level, read data RDATA3H and RDATA3L changes based on the logic level of the read data RDATA2. Specifically, if the read data RDATA2 is at a high level, both the pieces of read data RDATA3H and RDATA3L become a high level. If the read data RDATA2 is at a low level, both the pieces of read data RDATA3H and RDATA3L become a low level. Now, if the enable signal /OUTEN becomes a high level and the enable signal OUTEN a low level, the read data RDATA3H is fixed to a high level and the read data RDATA3L a low level regardless of the logic level of the read data RDATA2. The pieces of read data RDATA3H and RDATA3L constitute the read data RDATA3 shown in FIG. 6.

Figure 16:
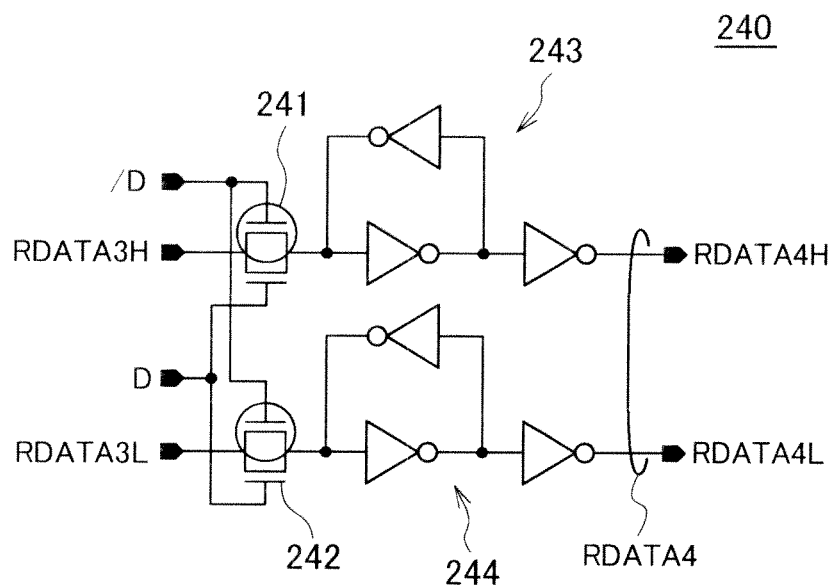
FIG. 16 is a circuit diagram of the output timing adjustment circuit shown in FIG. 6.

As shown in FIG. 16, the output timing adjustment circuit 240 includes transfer gates 241 and 242 and latch circuits 243 and 244. The transfer gates 241 and 242 become conducting when the timing signal D becomes a high level (a timing signal /D becomes a low level). As a result, the read data RDATA3H is latched into the latch circuit 243 through the transfer gate 241, and the read data RDATA3L is latched into the latch circuit 244 through the transfer gate 242. The output of the latch circuit 243 is used as read data RDATA4H. The output of the latch circuit 244 is used as read data RDATA4L. The pieces of read data RDATA4H and RDATA4L constitute the read data RDATA4 shown in FIG. 6.

Figure 17:
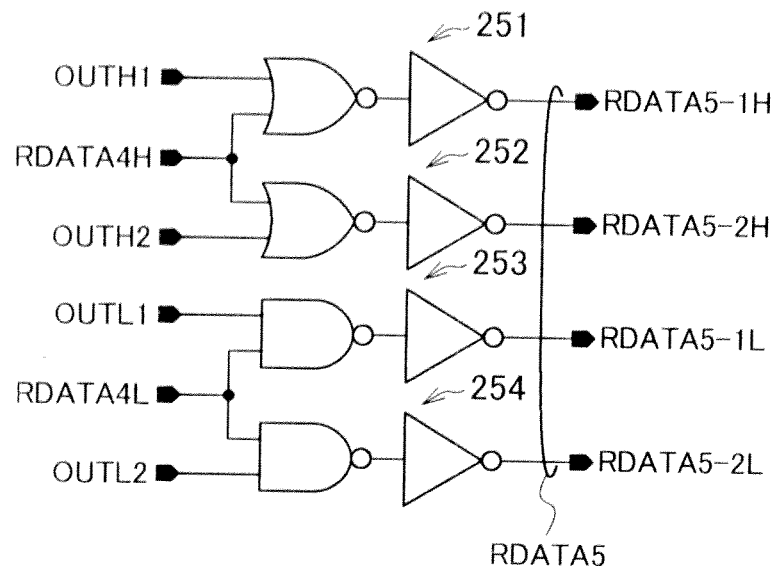
FIG. 17 is a circuit diagram of the output control unit shown in FIG. 6.

As shown in FIG. 17, the output control circuit 250 includes OR gate circuits 251 and 252 and AND gate circuits 253 and 254. The read data RDATA4H is supplied to the OR gate circuits 251 and 252 in common. Impedance control signals OUTH1 and OUTH2 are supplied to the OR gate circuits 251 and 252, respectively. The read data RDATA4L is supplied to the AND gate circuits 253 and 254 in common. Impedance control signals OUTL1 and OUTL2 are supplied to the AND gate circuits 253 and 254, respectively. The impedance signals OUTH1 and OUTH2 are signals such that either one or both is/are put to a low level. If the read data RDATA4H becomes a low level, corresponding read data RDATA5-1H and/or RDATA5-2H is activated to a low level. The impedance signals OUTL1 AND OUTL2 are signals such that either one or both is/are put to a high level. If the read data RDATA4L becomes a high level, corresponding read data RDATA5-1L and/or RDATA5-2L is activated to a high level. The pieces of read data RDATA5-1H, RDATA5-2H, RDATA5-1L, and RDATA5-2L constitute the read data RDATA5 shown in FIG. 6.

Figure 18:
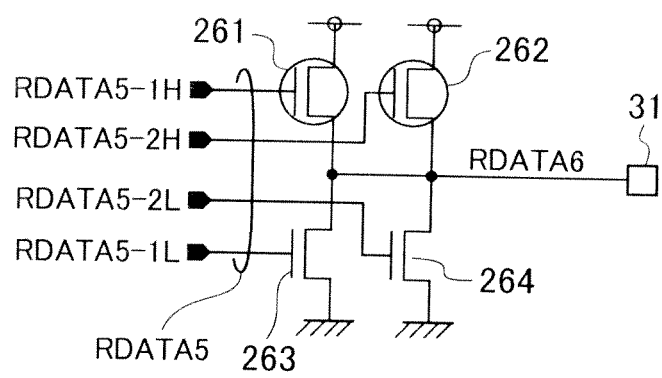
FIG. 18 is a circuit diagram of the output buffer circuit shown in FIG. 6.

As shown in FIG. 18, the output buffer circuit 260 includes transistors 261 to 264 whose drains are connected to the data terminal 31 in common. The transistors 261 and 262 are P-channel MOS transistors. The read data RDATA5-1H and RDATA5-2H is supplied to the gate electrodes of the transistors 261 and 262, respectively. The transistors 263 and 264 are N-channel MOS transistors. The read data RDATA5-1L and RDATA5-2L is supplied to the gate electrodes of the transistors 263 and 264, respectively. If either one or both of the pieces of read data RDATA5-1H and RDATA5-2H become(s) a low level, read data RDATA6 is driven to a high level. On the other hand, if either one or both of the pieces of read data RDATA5-1L and RDATA5-2L become(s) a low level, the read data RDATA6 is driven to a low level. The read data RDATA6 is supplied to the data terminal 31.

The specific circuit configurations of the circuit blocks constituting the read system circuit block 200 have been described above. Next, the positions of latch circuits lying in the section from a memory cell array 11 to data terminals 31 will be described.

Figure 19:
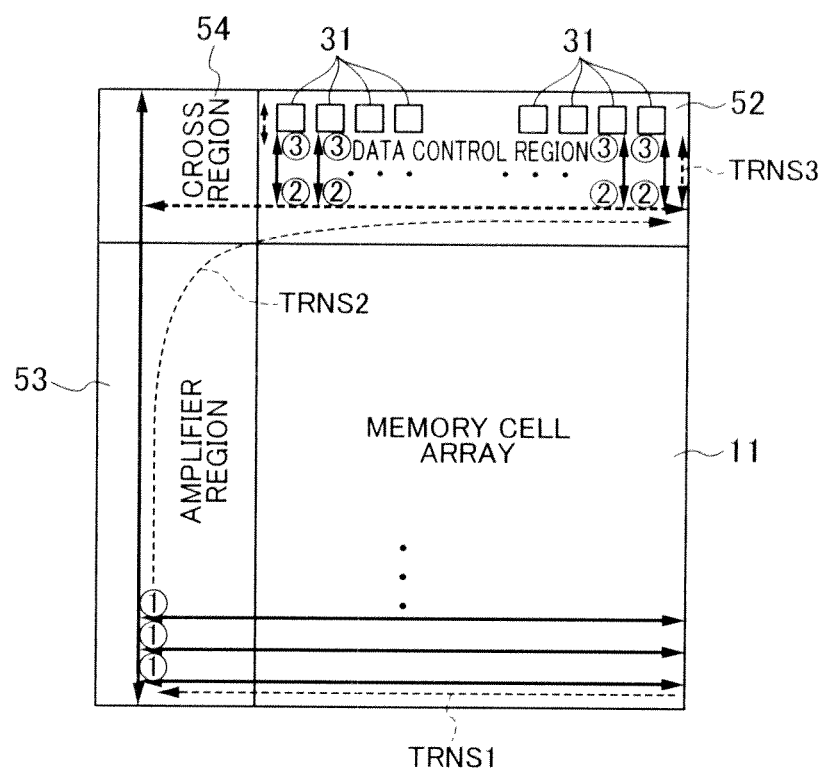
FIG. 19 is a schematic diagram for explaining the positions of the latch circuits lying in the section from the memory cell array 11 to the data terminals 31.

The positions of the latch circuits provided in the section from the memory cell array 11 to the data terminals 31 are shown in FIG. 19.

As shown in FIG. 19, there are three latch circuits in the section from a memory cell array 11 to a data terminal 31. In FIG. 19, latch circuits included in data amplifiers AMP are denoted by "1." In a read operation, the latch circuits L1 included in the read amplifiers RAMP correspond to such latch circuits. In a write operation, the latch circuits L2 included in the write amplifiers WAMP correspond to such latch circuits.

In FIG. 19, latch circuits included in data input/output circuits 30 are denoted by "2" and "3." In a read operation, the read data latch circuits 210 and 220 correspond to the latch circuits denoted by "2," and the output timing adjustment circuits 240 correspond to the latch circuits denoted by "3." In a write operation, the write data latch circuits 150 correspond to the latch circuits denoted by "2," and the write data latch circuits 130 correspond to the latch circuits denoted by "3."

By such three latch circuits, propagation paths of read data and write data are divided into four sections. As an example, a propagation path of read data will be described. The section from the memory cell array 11 to a latch circuit L1 denoted by "1" in FIG. 19 is a first section. The section from the latch circuit L1 denoted by "1" to read data latch circuits 210 and 220 denoted by "2" is a second section. The section from the read data latch circuits 210 and 220 denoted by "2" to an output timing adjustment circuit 240 denoted by "3" is a third section. The section from the output timing adjustment circuit 240 denoted by "3" to a data terminal 31 is a fourth section.

Figure 20:
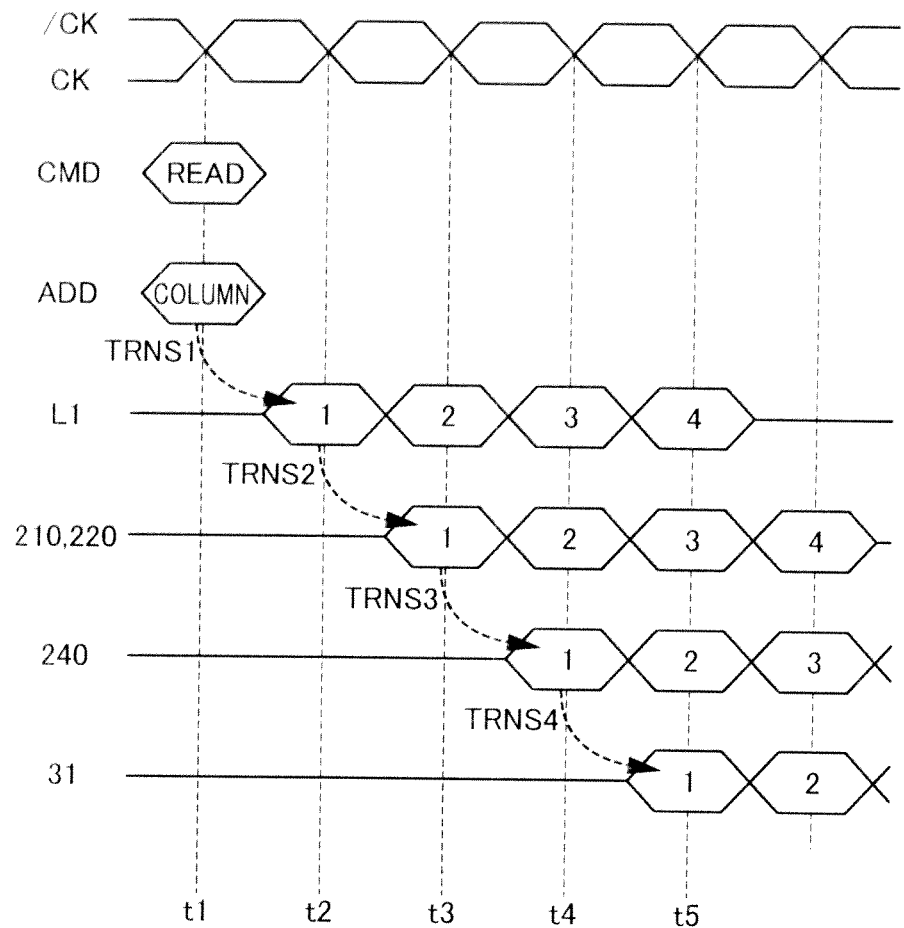
FIG. 20 is a timing chart for explaining the transfer of read data.

Turning to FIG. 20, a read command READ is issued and a column address COLUMN is input at timing t1. Predetermined read data is output from the memory cell array 11 and supplied to the read amplifier RAMP. In other words, the read data is transferred through the foregoing first section. The transfer in the first section needs to be completed by the next timing t2. The transfer in the section is performed by amplifying charge information stored in a memory cell. The transfer speed can thus be adjusted by modifying the size of the memory cell array and the characteristics of operation circuits such as a sense amplifier and a word driver.

At timing t2, the read data is latched into the latch circuit L1 included in the read amplifier RAMP. In other words, a transfer from the first section to the second section is performed. In FIG. 20, such a transfer is denoted by TRANS1. The read data latched in the latch circuit L1 is supplied to a data input/output circuit 30 through data buses DB2 and DB1 that constitute the second section. The transfer in the second section needs to be completed by the next timing t3. In FIG. 20, the transfer in the second section is denoted by TRANS2.

The length of the second section is determined by the positional relationship between the selected memory cell and the data control region 52. The second section is longer than the other sections. The path that constitutes the second section includes few operational circuits. The transfer speed is thus difficult to adjust by means of the characteristics of circuits lying in the path. The transfer speed in the second section is determined by the parasitic CR components of the data buses DB2 and DB1. The parasitic CR components depend on the layout. The longest path is the path to transfer data from the end of the memory cell array 11. Since the path length constitutes the worst condition, the transfer speed needs to be designed so that the transfer is completed by the timing t3 even under the worst condition. Large-capacity DRAMs inevitably have a large chip size, and the data buses DB2 and DB1 become accordingly long. If the number of lines is increased to reduce wiring pitches, increased parasitic CR components can make the transfer speed even lower.

At timing t3, the read data is latched into the read data latch circuits 210 and 220 included in the data input/output circuit 30. In other words, a transfer from the second section to the third section is performed. The read data latched in the read data latch circuits 210 and 220 is supplied to the output timing adjustment circuit 240 through the output enable logic circuit 230 that constitutes the third section. The transfer in the third section needs to be completed by the next timing t4. In FIG. 20, the transfer in the third section is denoted by TRANS3. Since the third section is short, the transfer can be performed with a sufficient margin.

At timing t4, the read data is latched into the output timing adjustment circuit 240. In other words, a transfer from the third section to the fourth section is performed. The read data latched in the output timing adjustment circuit 240 is supplied to the data terminal 31 through the output control circuit 250 and the output buffer circuit 260 that constitute the fourth section. The transfer in the fourth section needs to be completed by the next timing t5. In FIG. 20, the transfer in the fourth section is denoted by TRANS4. The fourth section is also short, and the transfer can be performed with a sufficient margin.

As described above, the transfer in the second section is the most time-consuming and difficult to adjust. In the semiconductor device 10 according to the present embodiment, the transfer speed in the second section is improved as compared to heretofore. Specific means will be described in detail below.

A configuration of the data control region 52 will be explained next.

Figure 21:
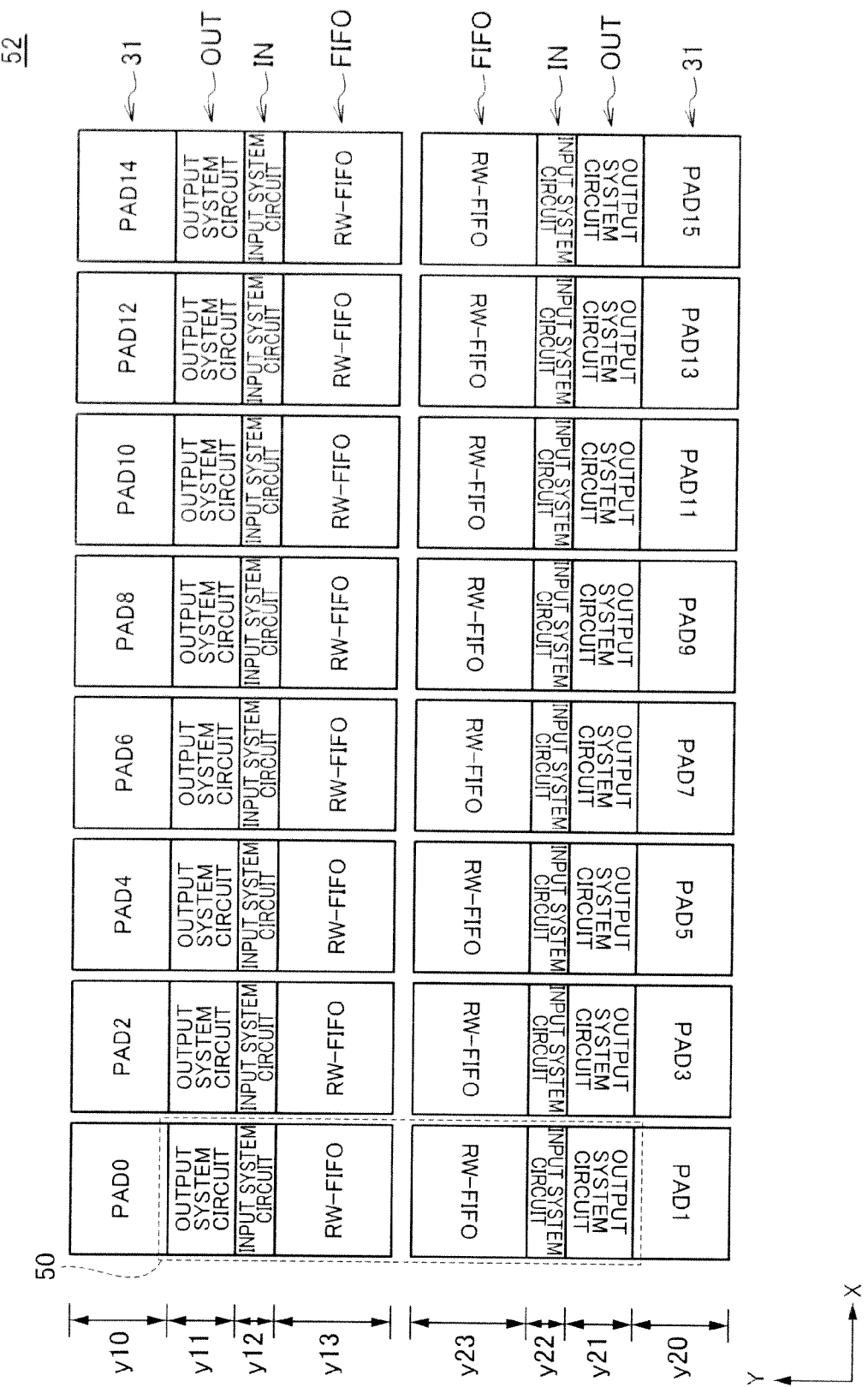
FIG. 21 is an enlarged plan view showing a part of the data control region shown in FIGS. 3A and 3B.

As shown in FIG. 21, according to the present embodiment, data terminals 31 extending in the X direction are arranged in two rows. Specifically, a plurality of terminals 31 are arranged at a coordinate y10 and a coordinate y20 in the Y direction. As an example, FIG. 21 shows 16 data terminals 31 (PAD0 to PAD15). In the present invention, the data terminals 31 arranged at the coordinate y10 may sometimes be referred to as "first ports." The data terminals 31 arranged at the coordinate y20 may sometimes be referred to as "second ports." The data input/output circuits 30 corresponding to the respective data terminals 31 are arranged in the area between the coordinates y10 and y20. In the present invention, the data input/output terminals 30 corresponding to the data terminals 31 at the coordinate y10 may sometimes be referred to as "first circuits." The data input/output circuits 30 corresponding to the data terminals 31 at the coordinate y20 may sometimes be referred to as "second circuits."

Output system circuits denoted by OUT in FIG. 21 are circuit blocks each including an output control circuit 250 and an output buffer circuit 260. The output system circuits OUT are arranged at coordinates y11 and y21 which are closest to the data terminals 31 in the Y direction. The reason why the output system circuits OUT are arranged closest to the data terminals 31 is that the output waveform and output timing of read data are finely specified by standards. In addition, the output paths to the corresponding data terminals 31 need to be minimized in length due to a demand for high speed operation.

Input system circuits denoted by IN in FIG. 21 are circuit blocks each including a first-stage signal amplification circuit 110 and a signal delay control circuit 120. The input system circuits IN are arranged at coordinates y12 and y22 which are closest to the data terminals 31 but the output system circuits OUT. Since write data is susceptible to noise and wiring loads, the input system circuits IN need to be located near the data terminals 31. However, the input system circuits IN are lower than the output system circuits OUT in priority, and thus are arranged in such a layout.

In FIG. 21, other circuit blocks that constitute the data input/output circuits 30 are denoted by RW-FIFO. Specifically, a circuit block RW-FIFO includes the write data latch circuit 130, the signal delay control circuit 140, the write data latch circuit 150, and the write data output buffer 160 included in a write system circuit block 100, and the read data latch circuits 210 and 220, the output enable logic circuit 230, and the output timing adjustment circuit 240 included in a read system circuit block 200. The circuit blocks RW-FIFO are arranged at coordinates y13 and y23 which are the next close to the data terminals 31 after the input system circuits IN.

The operation of the circuit blocks RW-FIFO is controlled by the timing signals A to D. The distances from the control lines through which the timing signals A to D are supplied are more important than the distances from the data terminals 31.

Figure 22:
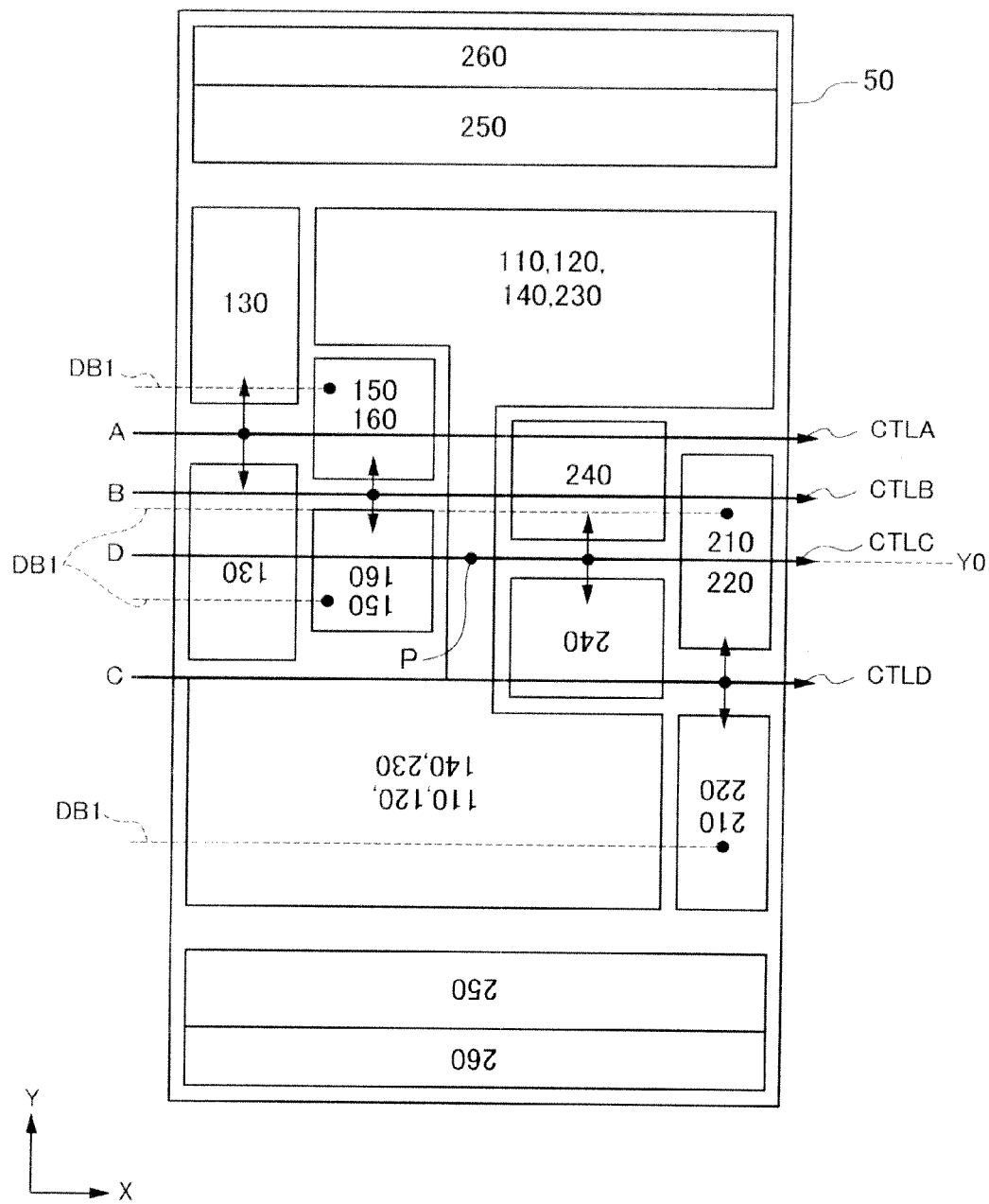
FIG. 22 is an enlarged plan view showing the area 50 shown in FIG. 21.

An enlarged plan view of the area 50 in FIG. 21 is shown in FIG. 22. The area 50 shown in FIG. 21 is where data input/output circuits 30 corresponding to two data terminals (PAD0 and PAD1) having the same X coordinate (adjoining in the Y direction) are arranged.

As shown in FIG. 22, according to the present embodiment, the two data input/output circuits 30 adjoining in the Y direction have different layouts. The two data input/output circuits 30 are neither axisymmetrically laid out with the intermediate coordinate Y0 in the Y direction as the axis of symmetry, nor are rotationally symmetrically laid out with the center point P as the axis of rotation. Instead, the circuit blocks using the timing signals A to D are laid out with reference to control lines CTLA to CTLD through which the timing signals are supplied. The control signals CTLA to CTLD each are a line extending in the X direction. The circuit blocks using the timing signals A to D correspond to the circuit blocks designated by the reference symbols 130, 150, 210, 220, and 240 shown in FIG. 22. Circuit blocks that do not use the timing signals A to D are appropriately laid out in the remaining areas. The circuit blocks that do not use the timing signals A to D correspond to the circuit blocks designated by the reference symbols 110, 120, 140, and 230 shown in FIG. 22.

Circuit blocks connected to the data buses DB1 are laid out so as to coincide with the Y coordinates of the corresponding data buses DB1. The circuit blocks connected to the data buses DB1 correspond to the circuit blocks designated by the reference symbols 160 and 210 shown in FIG. 22. In FIG. 22, the circuit blocks with noninverted symbols are those corresponding to the data terminal PAD0 shown in FIG. 21. The circuit blocks with inverted symbols are those corresponding to the data terminal PAD1 shown in FIG. 21. The same holds for subsequent diagrams. A more specific description will be given below.

Figure 23:
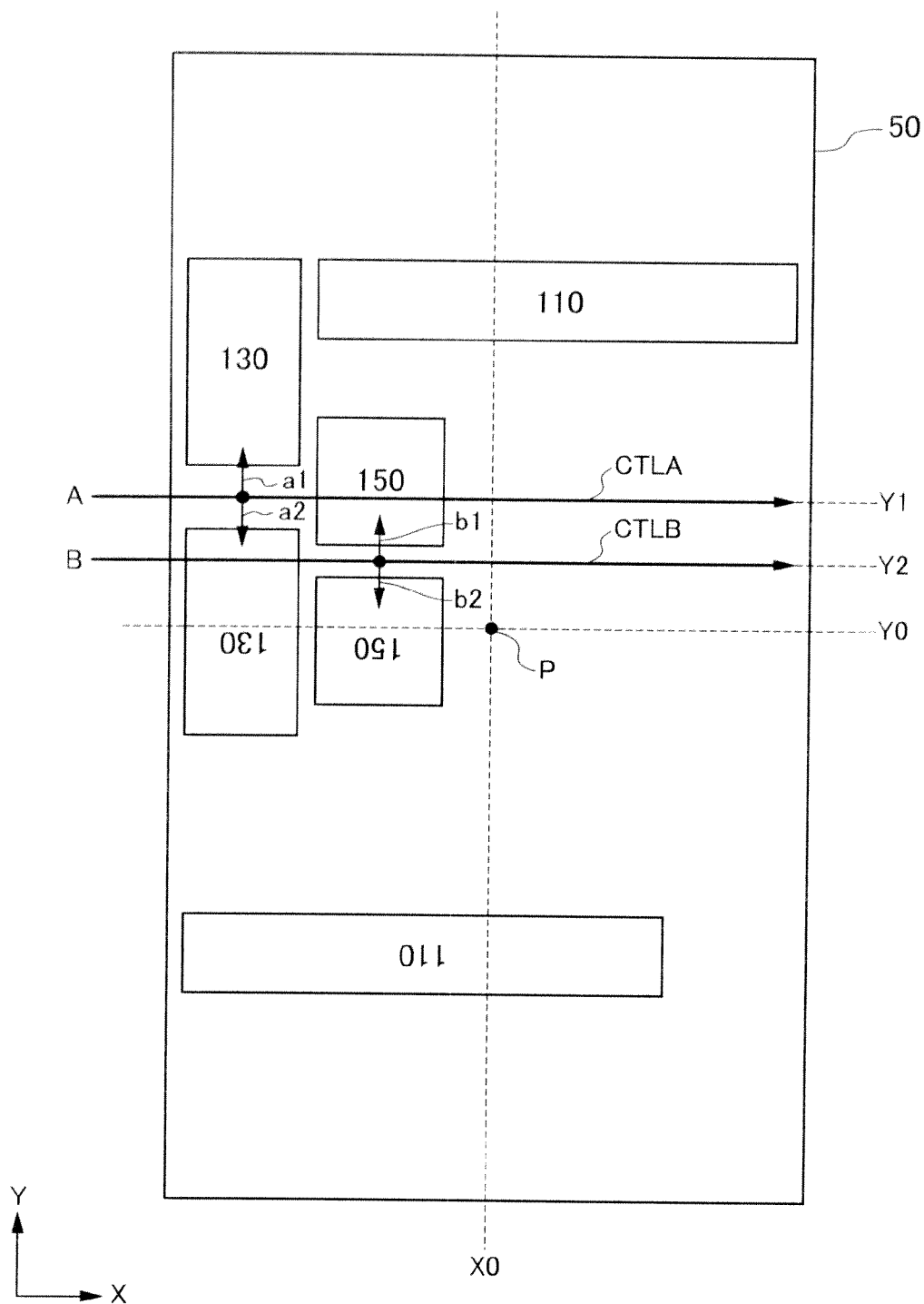
FIG. 23 is a plan view for explaining the layout of essential circuit blocks used in a write operation among the circuit blocks included in the two data input/output circuits 30 adjoining in the Y direction.

FIG. 23 shows only the first-stage signal amplification circuits 110 and the write data latch circuits 130 and 150 among the circuit blocks included in the data input/output circuits 30. As shown in FIG. 23, in the two data input/output circuits 30 adjoining in the Y direction, the first-stage signal amplification circuits 110 are rotationally symmetrically laid out with the center point P as the axis of rotation. The center point P refers to the intersection of the coordinate X0 of the corresponding two data terminals 31 (in the present example, PAD0 and PAD1) in the X direction and the intermediate coordinate Y0 of the same in the Y direction.

Meanwhile, the write data latch circuits 130 and 150 are not symmetrically laid out in the two data input/output circuits 30 adjoining in the Y direction. Specifically, the write data latch circuits 130 are axisymmetric 11y laid out with the coordinate Y1 of the control line CTLA in the Y direction as the axis of symmetry. The write data latch circuits 150 are axisymmetrically laid out with the coordinate Y2 of the control line CTLB in the Y direction as the axis of symmetry. As has been described with reference to FIG. 6, the write data latch circuits 130 are circuits that operate in synchronization with the timing signal A which is supplied through the control line CTLA. The write data latch circuits 150 are circuits that operate in synchronization with the timing signal B which is supplied through the control line CTLB.

With such a layout, the distance a1 from the control line CTLA to one of the write data latch circuits 130 in the Y direction coincides with the distance a2 from the control line CTLA to the other write data latch circuit 130 in the Y direction. Consequently, the timing signal A supplied through the control line CTLA is simultaneously input to the two write data latch circuits 130. Similarly, the distance b1 from the control line CTLB to one of the write data latch circuits 150 in the Y direction coincides with the distance b2 from the control line CTLB to the other write data latch circuit 150 in the Y direction. The Liming signal B supplied through the control line CTLB is thus simultaneously input to the two write data latch circuits 150.

Figure 24:
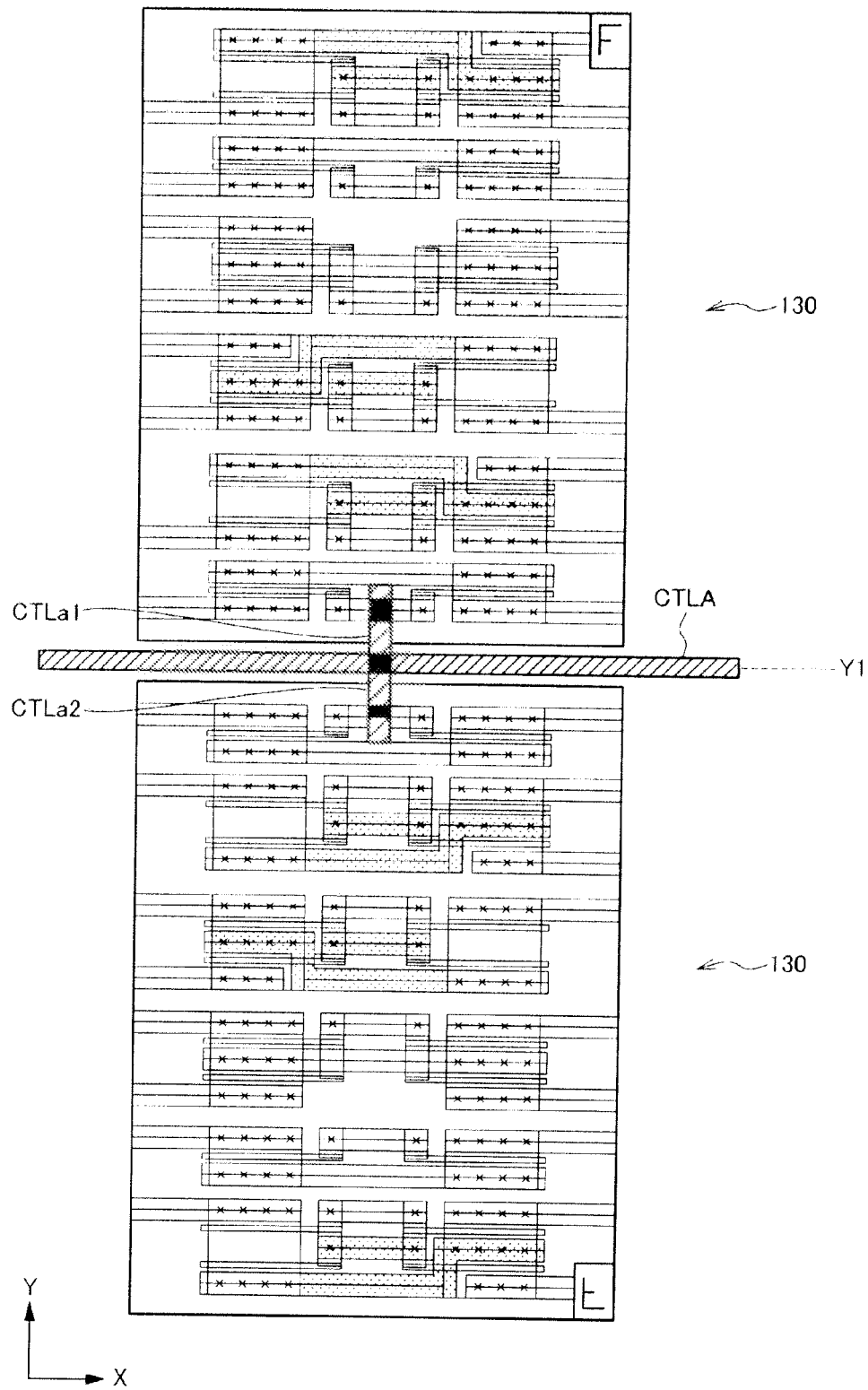
FIG. 24 is a plan view showing in a transistor level the two write data latch circuits 130 shown in FIG. 23.

Turning to FIG. 24, the write data latch circuit 130 shown above the coordinate Y1 is the one corresponding to the data terminal PAD0. The write data latch circuit 130 shown below the coordinate Y1 is the one corresponding to the data terminal PAD1. As shown in FIG. 24, the two write data latch circuits 130 are laid out axisymmetrically in a transistor level with the coordinate Y1 as the axis of symmetry. Branch lines CTLa1 and CTLa2 branched from the control line CTLA in the Y direction thus have the same, minimum length. The marks F shown in FIG. 24 indicate the orientations of the circuits. The marks F show that the two write data latch circuits 130 are axisymmetrical.

Figure 25:
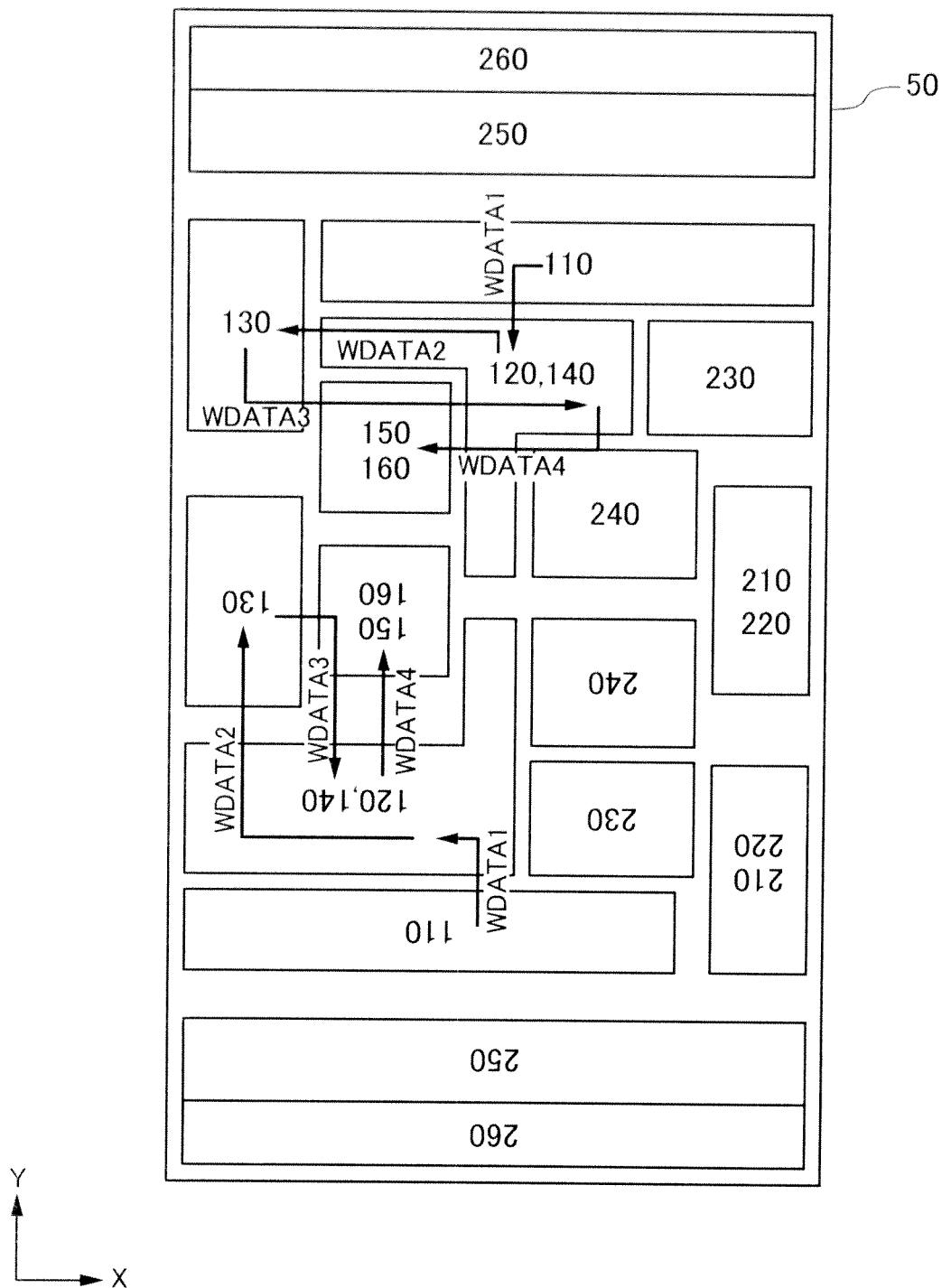
FIG. 25 is a schematic diagram for explaining the flow of write data in the two data input/output circuits 30 adjoining in the Y direction.

The pieces of write data WDATA1 to WDATA4 shown in FIG. 25 represent those described with reference to FIG. 6. As shown in FIG. 25, the two data input/output circuits 30 are not symmetrical. The signal paths of the write data WDATA1 to WDATA4 flowing through the upper data input/output circuit 30 do not perfectly correspond to those of the write data WDATA1 to WDATA4 flowing through the lower data input/output circuit 30. For example, the write data WDATA2 flows a short path in the upper data input/output circuit 30, and a long path in the lower data input/output circuit 30. On the other hand, the write data WDATA3 flows a long path in the upper data input/output circuit 30, and a short path in the lower data input/output circuit 30.

Due to the differences of the signal paths, the write data has different propagation characteristics in the upper data input/output circuit 30 and the lower data input/output circuit 30. Such a problem, however, can be solved by adjusting the power of the transistors constituting the circuit blocks and the capacitive and resistive components of the lines in a design phase.

Figure 26:
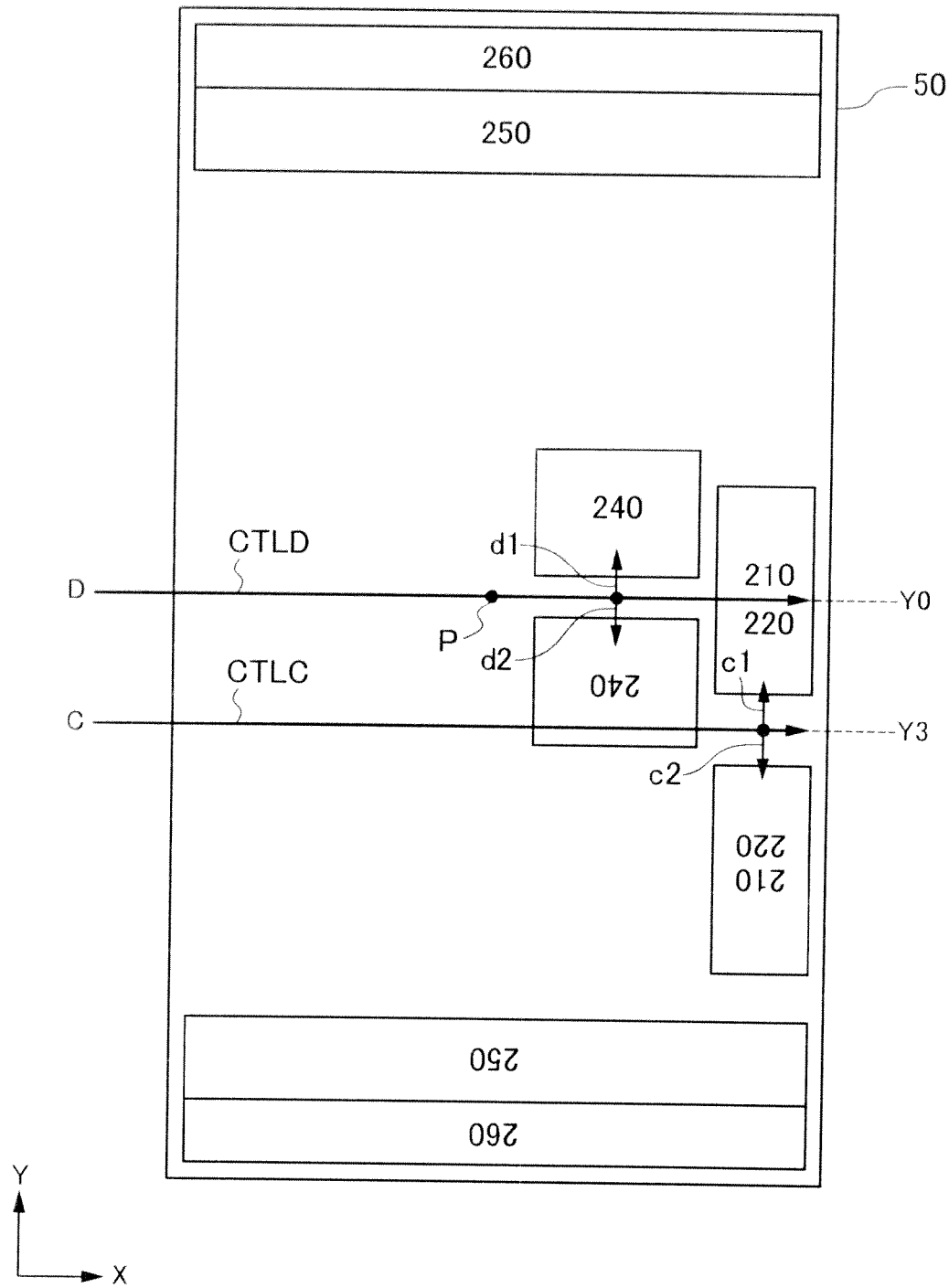
FIG. 26 is a plan view for explaining the layout of essential circuit blocks used in a read operation among the circuit blocks included in the two data input/output circuits 30 adjoining in the Y direction.

FIG. 26 shows only the read data latch circuits 210 and 220, the output timing adjustment circuits 240, the output control circuits 250, and the output buffer circuits 260 among the circuit blocks included in the data input/output circuits 30. As shown in FIG. 26, in the two data input/output circuits 30 adjoining in the Y direction, the output control circuits 250 and the output buffer circuits 260 are axisymmetrically laid out with the intermediate coordinate Y0 as the axis of symmetry.

On the other hand, the read data latch circuits 210 and 220 and the output timing adjustment circuits 240 are not symmetrically laid out in the two data input/output circuits 30 adjoining in the Y direction. Specifically, the read data latch circuits 210 and 220 are axisymmetrically laid out with the coordinate Y3 of the control line CTLC in the Y direction as the axis of symmetry. The output timing adjustment circuits 240 are axisymmetrically laid out with the coordinate Y0 of the control line CTLD in the Y direction as the axis of symmetry. The coordinate Y0 of the control line CTLD in the Y direction coincides with the intermediate coordinate Y0 of the two data terminals 31 adjoining in the Y direction. As has been described with reference to FIG. 6, the read data latch circuits 210 and 220 are circuits that operate in synchronization with the timing signal C which is supplied through the control line CTLC. The output timing adjustment circuits 240 are circuits that operate in synchronization with the timing signal D which is supplied through the control line CTLD.

With such a layout, the distance c1 from the control line CTLC to either one of the pairs of read data latch circuits 210 and 220 in the Y direction coincides with the distance c2 from the control line CTLC to the other pair of read data latch circuits 210 and 220 in the Y direction. Consequently, the timing signal C supplied through the control line CTLC is simultaneously input to the two pairs of read data latch circuits 210 and 220. Similarly, the distance d1 from the control line CTLD to one of the output timing adjustment circuits 240 in the Y direction coincides with the distance d2 from the control line CTLD to the other output timing adjustment circuit 240 in the Y direction. The timing signal D supplied through the control line CTLD is thus simultaneously input to the two output timing adjustment circuits 240.

Figure 27:
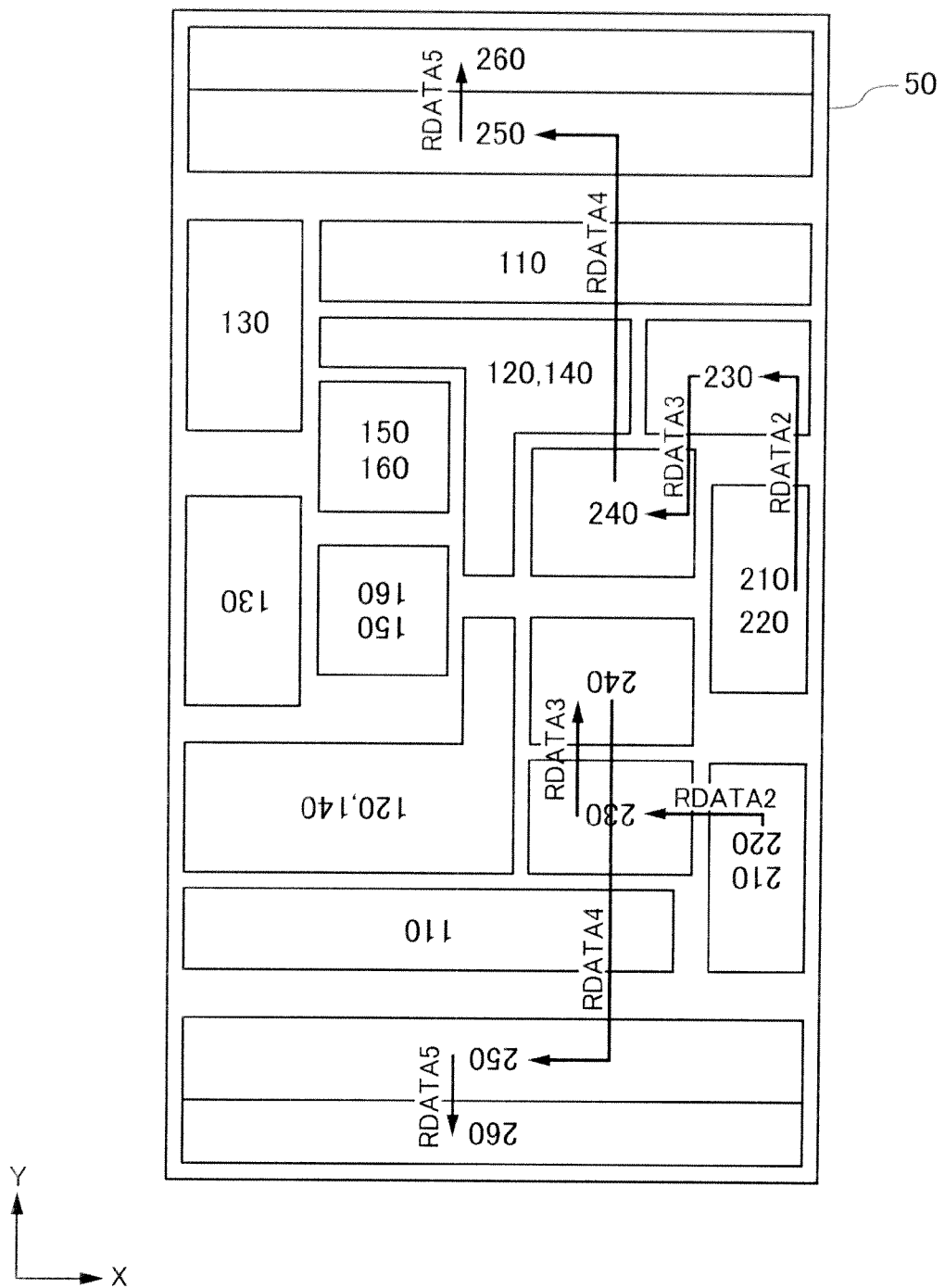
FIG. 27 is a schematic diagram for explaining the flow of read data in the two data input/output circuits 30 adjoining in the Y direction.

The pieces of read data RDATA2 to RDATA5 shown in FIG. 27 represent those described with reference to FIG. 6. As shown in FIG. 27, the two data input/output circuits 30 are not symmetrical. The signal paths of the read data RDATA2 to RDATA5 flowing through the upper data input/output circuit 30 do not perfectly correspond to those of the read data RDATA2 to RDATA5 flowing through the lower data input/output circuit 30. For example, the read data RDATA2 flows a long path in the upper data input/output circuit 30, and a short path in the lower data input/output circuit 30.

Due to the differences of the signal paths, the read data has different propagation characteristics in the upper data input/output circuit 30 and the lower data input/output circuit 30. Such a problem can also be solved by adjusting the power of the transistors constituting the circuit blocks and the capacitive and resistive components of the lines in a design phase.

Figure 28:
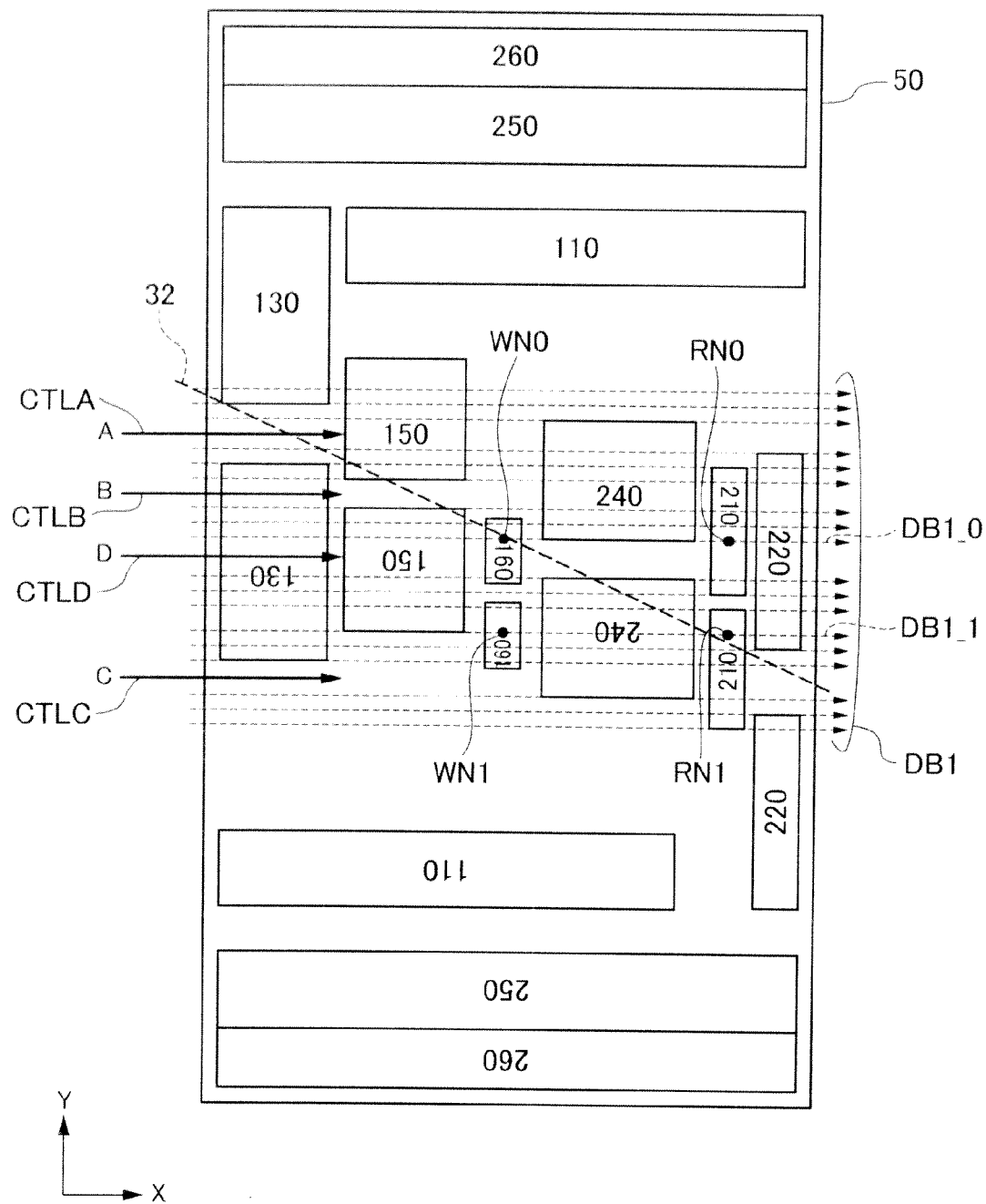
FIG. 28 is a plan view for explaining the relationship between the two data input/output circuits 30 adjoining in the Y direction and data buses DB1.

The relationship between the two data input/output circuits 30 adjoining in the Y direction and data buses DB1 is shown in FIG. 28. For the sake of simplicity, several circuit blocks constituting the data input/output circuits 30 are omitted in FIG. 28.

As shown in FIG. 28, the data buses DB1 are arranged in the X direction in parallel with the control lines CTLA to CTLD. The data bus DB1 and the control lines CTLA to CTLD are formed, though not limited in particular, by using the same wiring layer. The data buses DB1 are therefore not possible to be laid at the Y coordinates where the control lines CTLA to CTLD are arranged.

In the example shown in FIG. 28, a plurality of data buses DB1 include a data bus DB1_0 which corresponds to the upper data input/output circuit 30 and a data DB1_1 which corresponds to the lower data input/output circuit 30. In the present invention, the data bus DB1_0 may sometimes be referred to as a "first data line." The data bus DB1_1 may sometimes be referred to as a "second data line." The Y coordinates of both the write data output buffer 160 and the read data latch circuit 210 included in the upper data input/output circuit 30 cover the Y coordinate of the data bus DB1_0. Similarly, the Y coordinates of both the write data output buffer 160 and the read data latch circuit 210 included in the lower data input/output circuit 30 cover the Y coordinate of the data bus DB1_1.

Consequently, the data buses DB1 can be directly connected to the write data output buffers 160 and the read data latch circuits 210 without the data buses DB1 being branched in the Y direction. The write node WN0 and the read node RN0 shown in FIG. 28 represent through hole electrodes that connect the data bus DB1_0 to the corresponding write data output buffer 160 and read data latch circuit 210. Similarly, the write node WN1 and the read node RN1 represent through hole electrodes that connect the data bus DB1_1 to the corresponding write data output buffer 160 and read data latch circuit 210.

The imaginary line 32 shown in FIG. 28 is an imaginary border between the upper data input/output circuit 30 and the lower data input/output circuit 30. The data input/output circuits 30 are not exactly divided by the imaginary line 32 as a border, but can be generally said to be divided by the imaginary line 32 as a border.

Figure 29:
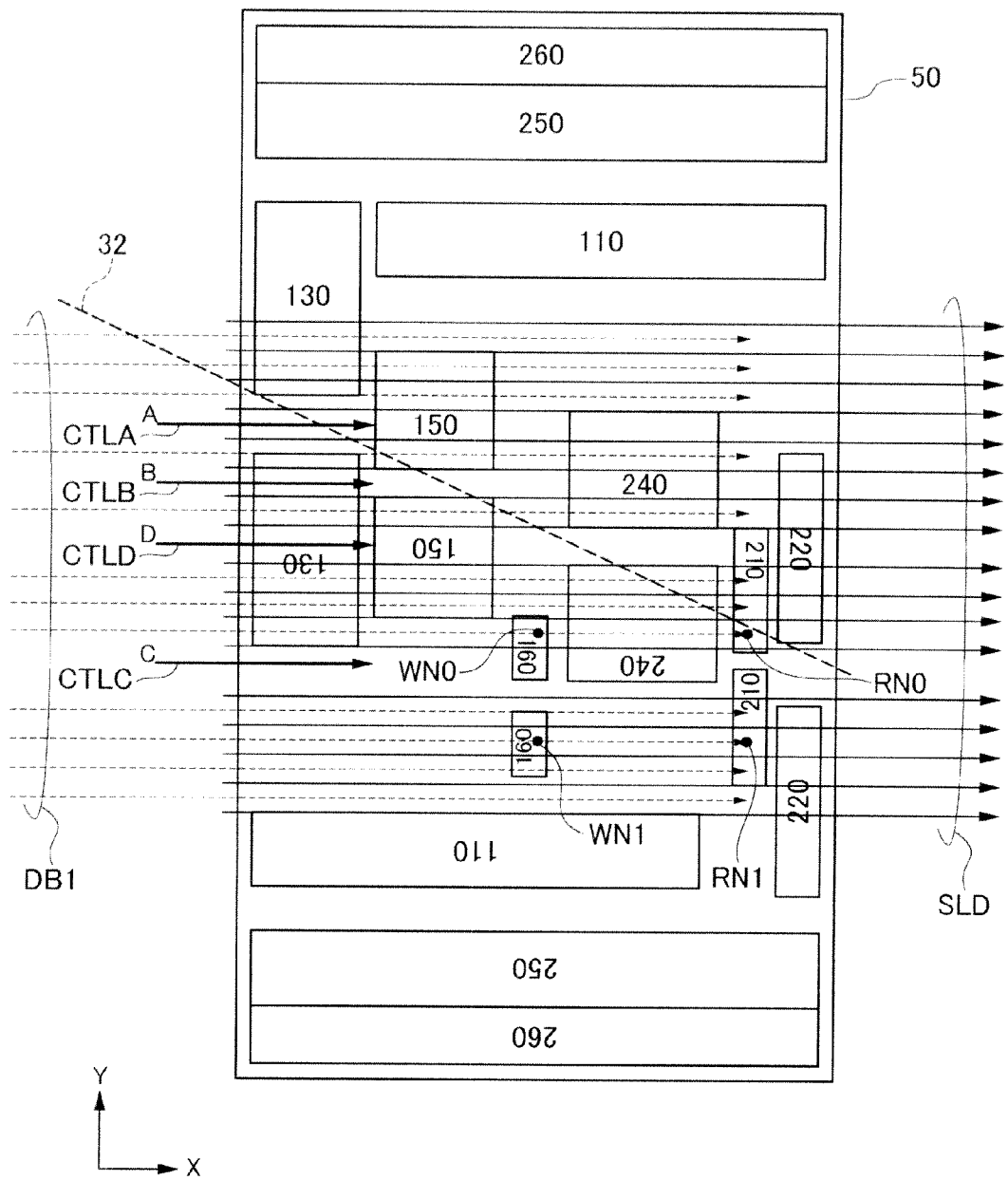
FIG. 29 is another plan view for explaining the relationship between the two data input/output circuits 30 adjoining in the Y direction and the data buses DB1.

The relationship between the two data input/output circuits 30 adjoining in the Y direction and the data buses DB1 is shown in FIG. 29. For the sake of simplicity, several circuit blocks constituting the data input/output circuits 30 are omitted in FIG. 29.

In the example shown in FIG. 29, shield wiring SLD is laid between the data buses DB1 and the control lines CTLA to CTLD adjoining in the Y direction. The shield wiring SLD reduces crosstalk between the adjoining lines. The provision of such shield wiring SLD increases the width of the wiring area in the Y direction needed to lay the data buses DB1 and the control lines CTLA to CTLD. The positions of the write data output buffers 160 and the read data latch circuits 210 in the Y direction can be shifted accordingly to provide the same effect as with the example shown in FIG. 28.

In the layout shown in FIG. 29, the write data output buffers 160 and the read data latch circuits 210 need to be shifted in position in the Y direction. For example, the write data output buffer 160 belonging to the upper data input/output circuit 30 is located far below the imaginary line 32. As can be seen from such an example, the imaginary line 32 is a solely conceptual one. The circuit blocks are not exactly divided with the imaginary line 32 as a border.

Figure 30:
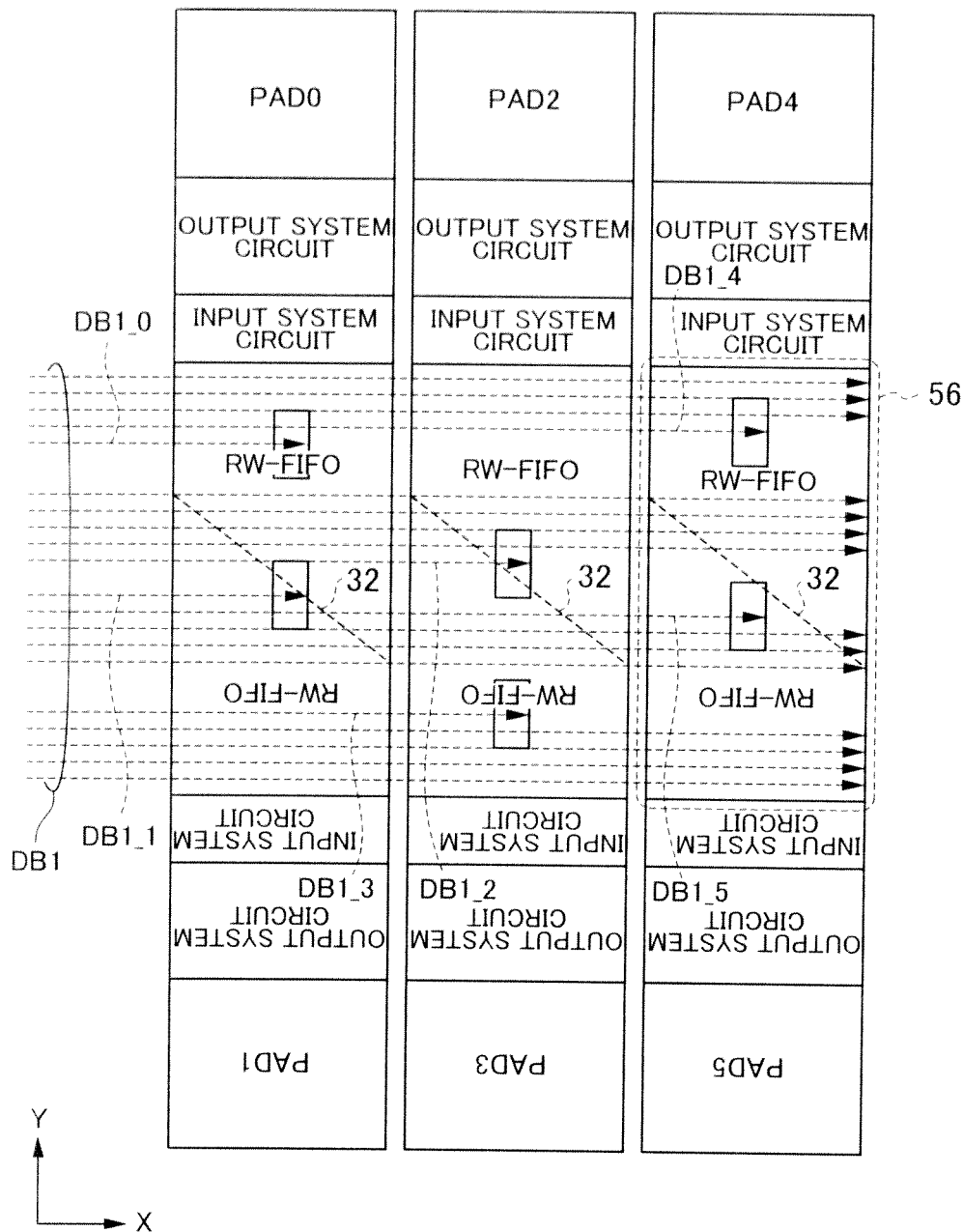
FIG. 30 is a schematic plan view for explaining the positions of write data output buffers 160.
Figure 31:
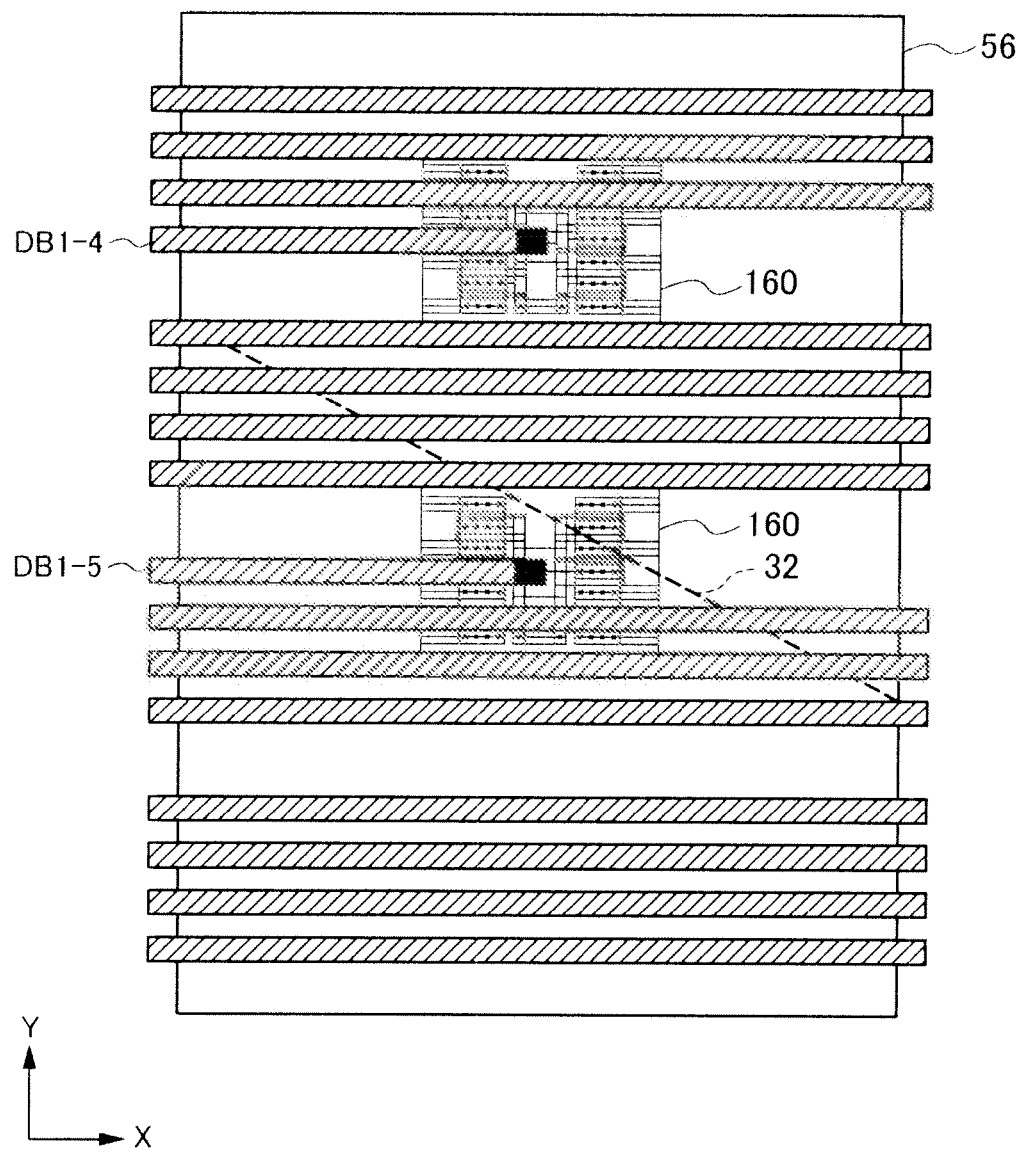
FIG. 31 is an enlarged view of the area 56 shown in FIG. 30.

As has been described, the write data output buffers 160 included in the data input/output circuits 30 are arranged directly beneath the respective corresponding data buses DB1. This means that the positions of the write data output buffers 160 in the Y direction need to be shifted from each other in a plurality of data input/output circuits 30 arranged in the X direction. In the example shown in FIG. 30, write data output buffers 160 corresponding to the data terminals PAD0 to PAD5 are mutually shifted in position in the Y direction, and thereby connected directly to the respective corresponding data buses DB1_0 to DB1_5. FIG. 31 is an enlarged view of the area 56 shown in FIG. 30. FIG. 31 shows that the write data output buffers 160 and the corresponding data buses DB1_4 and DB1_5 are directly connected via through hole electrodes without the intermediary of branch lines in the Y direction.

As described above, in the present embodiment, the timing signals A to D are each input to the two data input/output circuits 30 adjoining in the Y direction at the same time. The data input/output circuits 30 thus have the same operation margins. This means that the transfer TRANS2 from the second section to the third section, described in conjunction with FIGS. 19 and 20, is sped up. It is therefore possible to minimize the effect of low transfer speed in the second section which becomes more significant with increasing chip area.

Now, a prototype that the inventor has conceived in the process of achieving the present invention will be described for the sake of understanding of the present embodiment's superiority.

Figure 32:
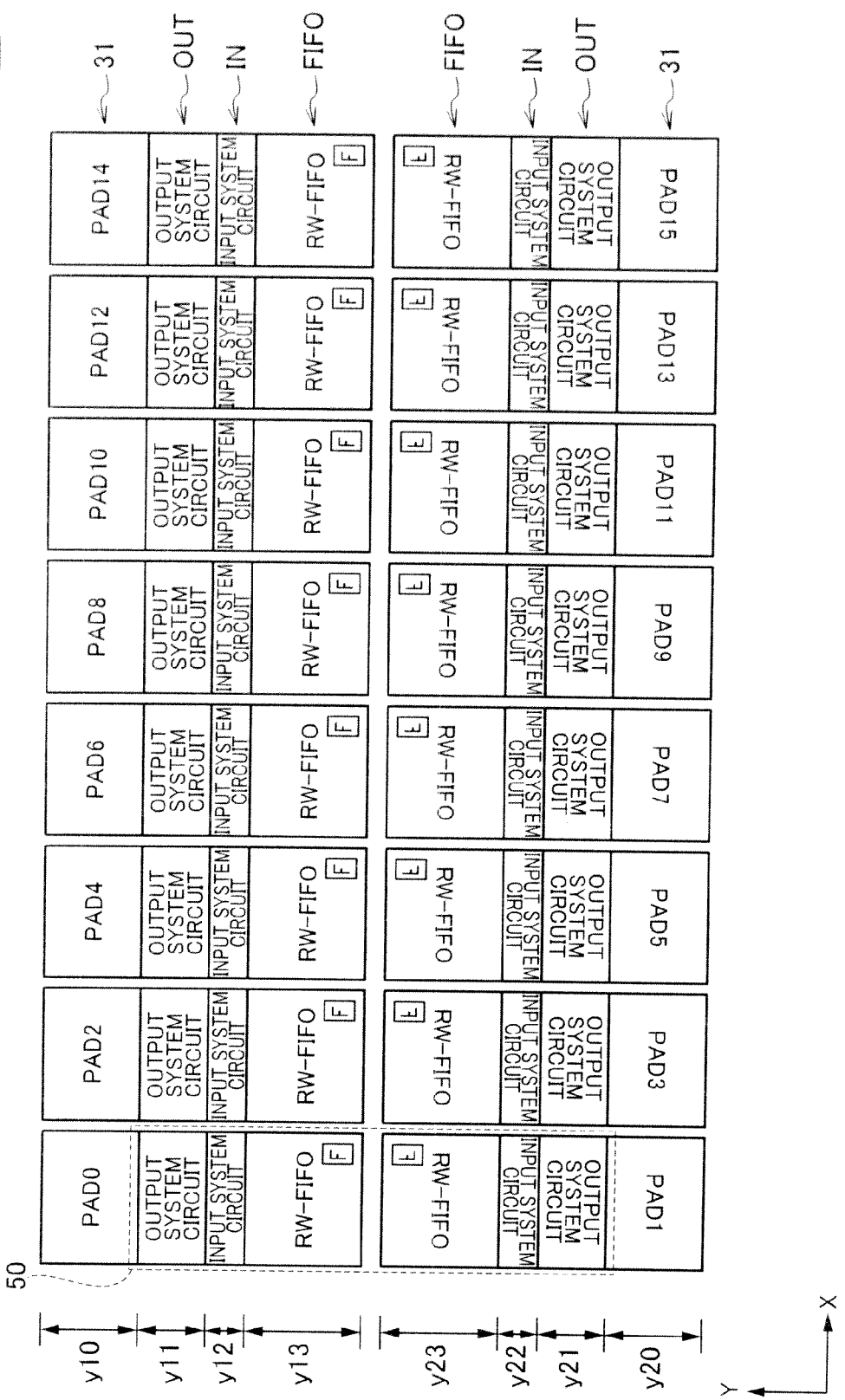
FIG. 32 is an enlarged plan view showing a part of a data control region 52 according to a prototype in the course of making the present invention.

Turning to FIG. 32, there is an enlarged plan view showing a part of a data control region 52 according to the prototype. FIG. 32 corresponds to FIG. 21 seen above. In the prototype shown in FIG. 32, data input/output circuits 30 are given the mark F. Two data input/output circuits 30 adjoining in the Y direction have the marks F in 180° different directions. This means that the two data input/output circuits 30 adjoining in the Y direction are axisymmetrically laid out with the intermediate coordinate Y0 as the axis of symmetry.

Figure 33:
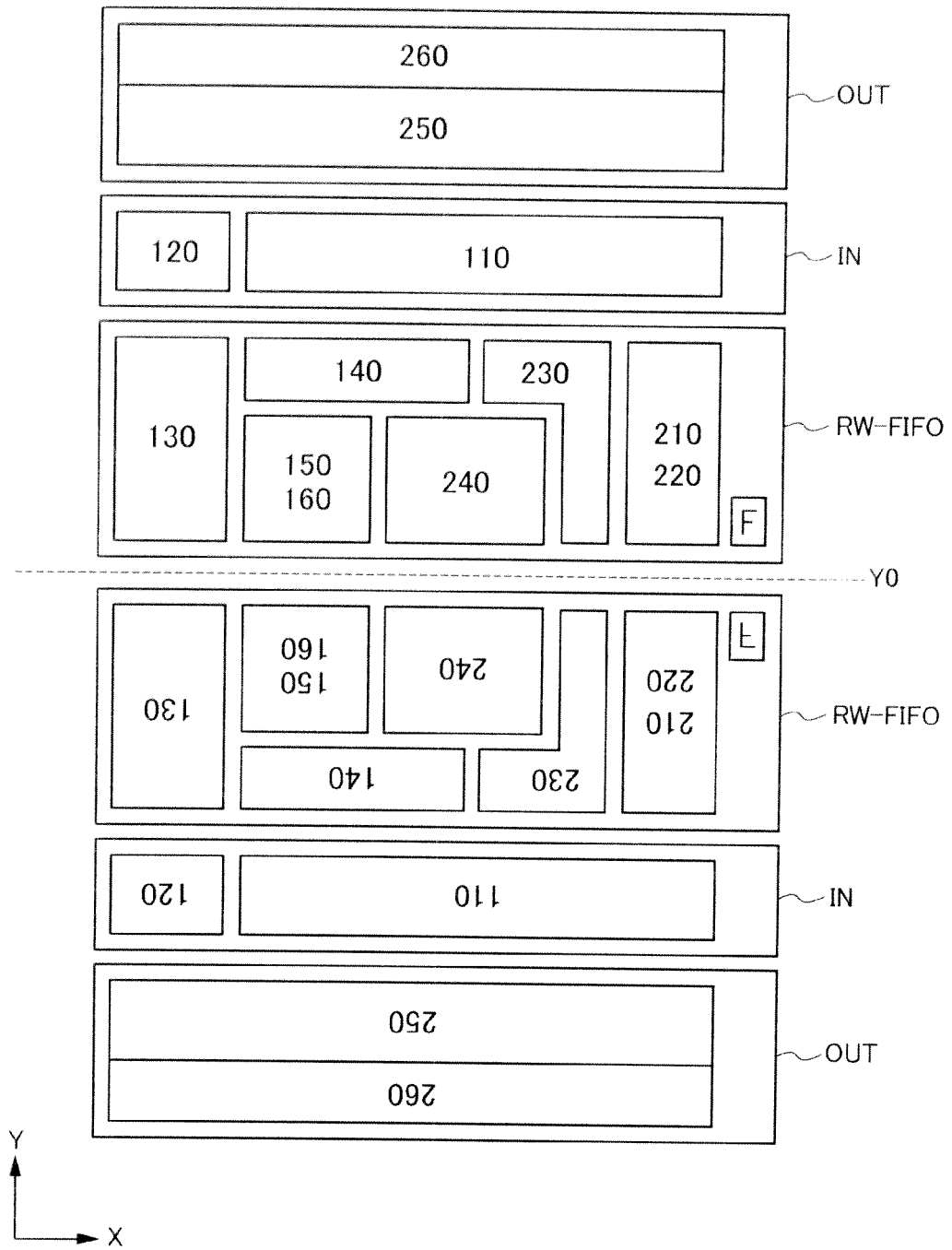
FIG. 33 is an enlarged plan view of the area 50 shown in FIG. 32.

Turning to FIG. 33, there is an enlarged plan view of the area 50 shown in FIG. 32. FIG. 33 corresponds to FIG. 22 seen above. As shown in FIG. 33, in the prototype, the two data input/output circuits 30 adjoining in the Y direction are axisymmetrically laid out. The axis of symmetry is the intermediate coordinate Y0. The circuit blocks included in the upper data input/output circuit 30 and the corresponding circuit blocks included in the lower data input/output circuit 30 all have an intermediate coordinate of Y0 in the Y direction.

Figure 34:
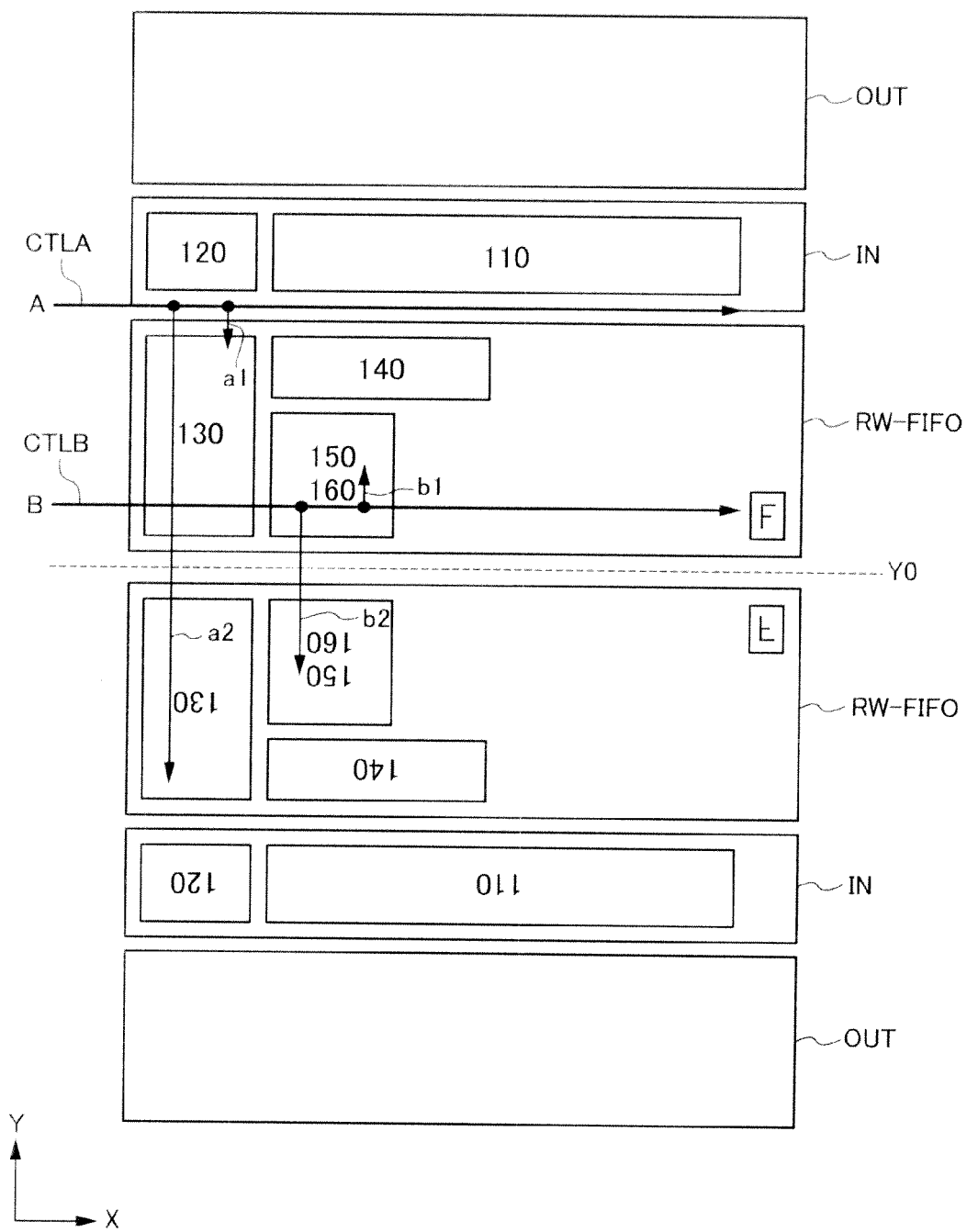
FIG. 34 is a plan view for explaining the layout of essential circuit blocks used in a write operation among the circuit blocks shown in FIG. 33.

Turning to FIG. 34, there is a plan view for explaining the layout of essential circuit blocks used in a write operation among the circuit blocks shown in FIG. 33. FIG. 34 corresponds to FIG. 23 seen above.

In the example shown in FIG. 34, control lines CTLA and CTLB are positioned at Y coordinates different from the intermediate coordinate Y0. Consequently, the distance a1 from the control line CTLA to one of the write data latch circuits 130 in the Y direction inevitably differs from the distance a2 from the control line CTLA to the other write data latch circuit 130 in the Y direction. In the example shown in FIG. 34, a1<a2. The timing signal A is thus input to the two write data latch circuits 130 with a slight difference in timing. Similarly, the distance b1 from the control line CTLB to one of the write data latch circuits 150 in the Y direction inevitably differs from the distance b2 from the control line CTLB to the other write data latch circuit 150 in the Y direction. In the example shown in FIG. 34, b1>b2. The timing signal B is thus input to the two write data latch circuits 150 with a slight difference in timing.

Figure 35:
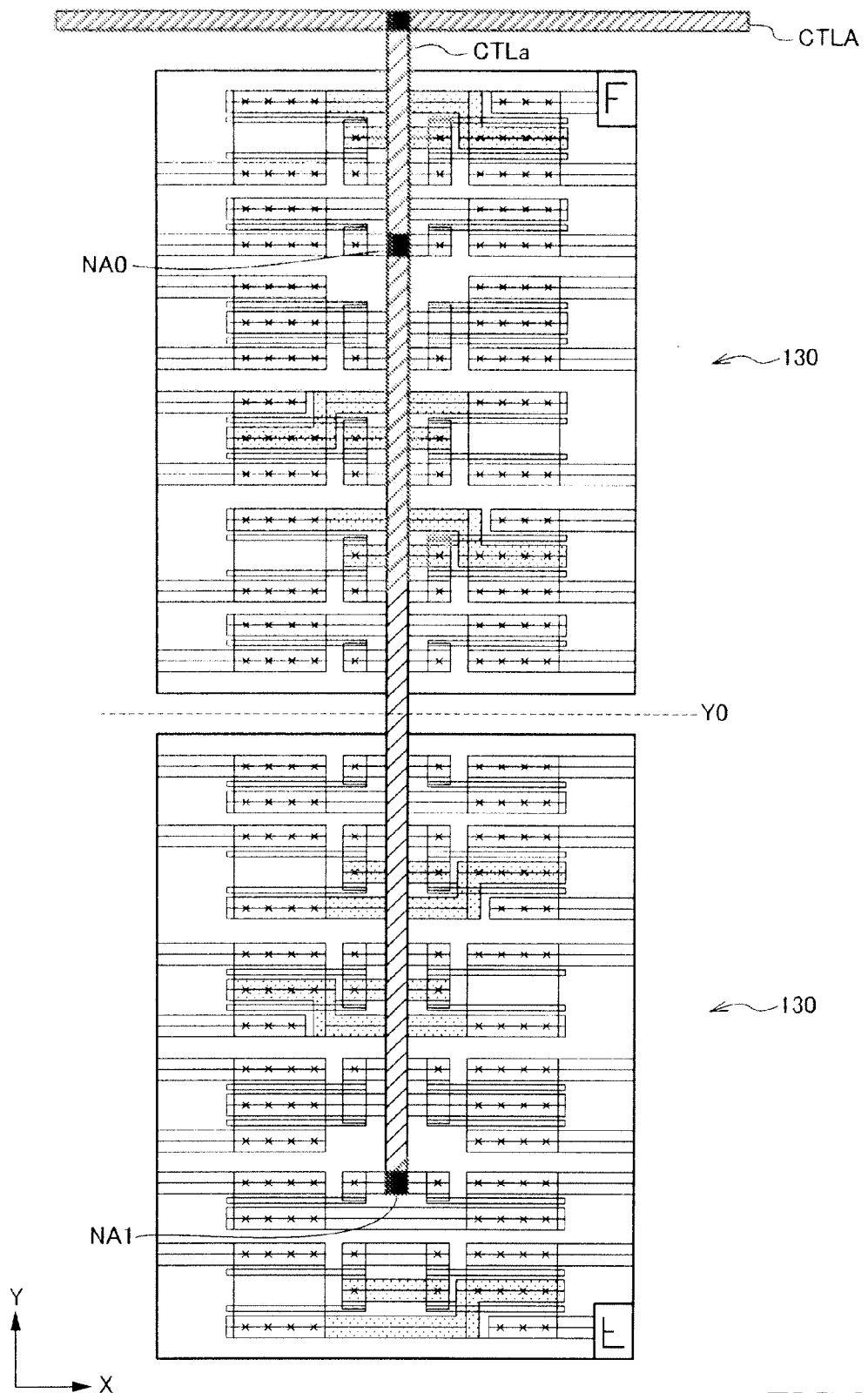
FIG. 35 is a plan view showing two write data latch circuits 130 according to the prototype in a transistor level.

As shown in FIG. 35, the two write data latch circuits 130 are laid out axisymmetrically in a transistor level with the intermediate coordinate Y0 as the axis of symmetry. The intermediate coordinate Y0 is different from the Y coordinate of the control line CTLA. A branch line CTLa branched from the control line CTLA in the Y direction has an input node NA0 corresponding to the upper write data latch circuit 130 and an input node NA1 corresponding to the lower write data latch circuit 130. The timing signal A is input through such input nodes. As shown in FIG. 35, the distance from the control line CTLA to the input node NA0 differs greatly from the distance to the input node NA1.

Figure 36:
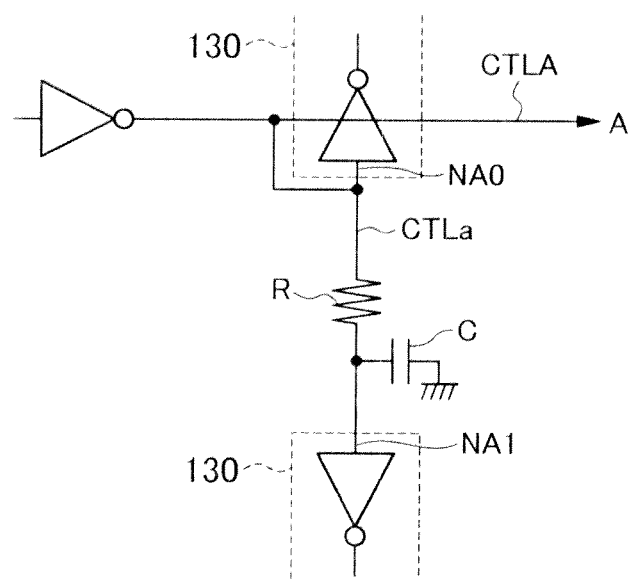
FIG. 36 is a circuit image of the branch line CTLa.

Turning to FIG. 36, the input timing of the timing signal A input to the lower write data latch circuit 130 lags somewhat behind the input timing of the timing signal A input to the upper write data latch circuit 130 due to the effect of the resistive component R and the capacitive component C of the branch line CTLa. Since circuit design needs to be tailored to slower timing, the transfer TRANS2 from the second section to the third section is retarded.

Figure 37:
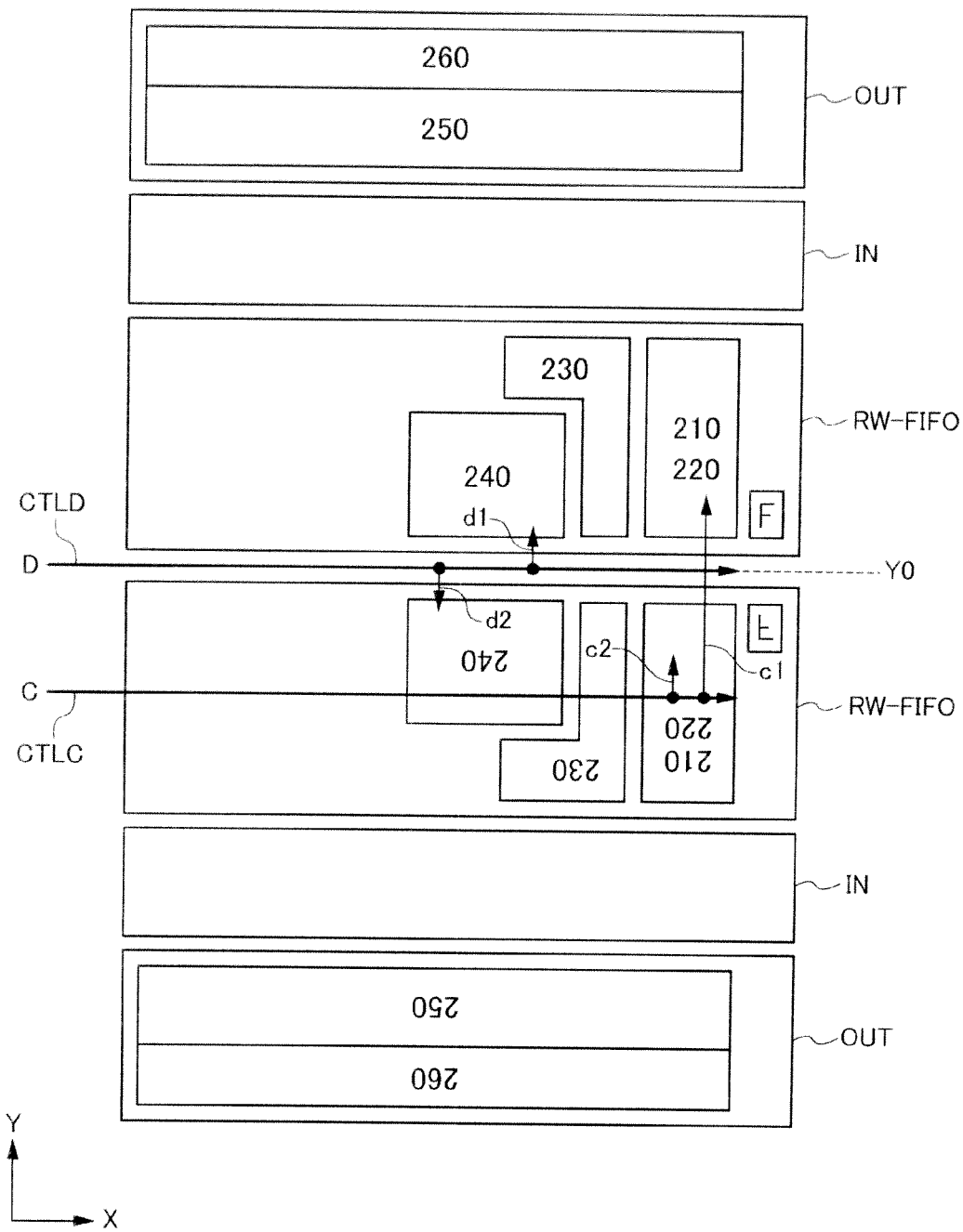
FIG. 37 is a plan view for explaining the layout of essential circuit blocks used in a read operation among the circuit blocks shown in FIG. 33.

Turning to FIG. 37, there is a plan view for explaining the layout of essential circuit blocks used in a read operation among the circuit blocks shown in FIG. 33. FIG. 37 corresponds to FIG. 26 seen above.

In the example shown in FIG. 37, a control line CTLC is located at a Y coordinate different from the intermediate coordinate Y0. A control line CTLD is located at the intermediate coordinate Y0. Consequently, the distance c1 from the control line CTLC to either one of the pairs of read data latch circuits 210 and 220 in the Y direction inevitably differs from the distance c2 from the control line CTLC to the other pair of read data latch circuits 210 and 220 in the Y direction. In the example shown in FIG. 37, c1>c2. The timing signal C is thus input to the two pairs of read data latch circuits 210 and 220 with a slight difference in timing. On the other hand, the control line CTLD lies at the intermediate coordinate Y0. The distance d1 from the control line CTLD to one of the output timing adjustment circuits 240 in the Y direction therefore coincides with the distance d2 from the control line CTLD to the other output timing adjustment circuit 240 in the Y direction.

As described above, if two data input/output circuits 30 adjoining in the Y direction are axisymmetrically laid out, only the timing signal D from the control line CTLD lying at the intermediate coordinate Y0 is simultaneously supplied to two circuit blocks. In other words, the number of timing signals that can be simultaneously supplied to two circuit blocks is limited to one. Unlike the present embodiment, it is not possible to simultaneously supply the plurality of timing signals A to D to the respective corresponding two blocks.

Now, the effect of the resistive component R and the capacitive component C of the branch line CTLa on a circuit operation will be described.

Figure 38:
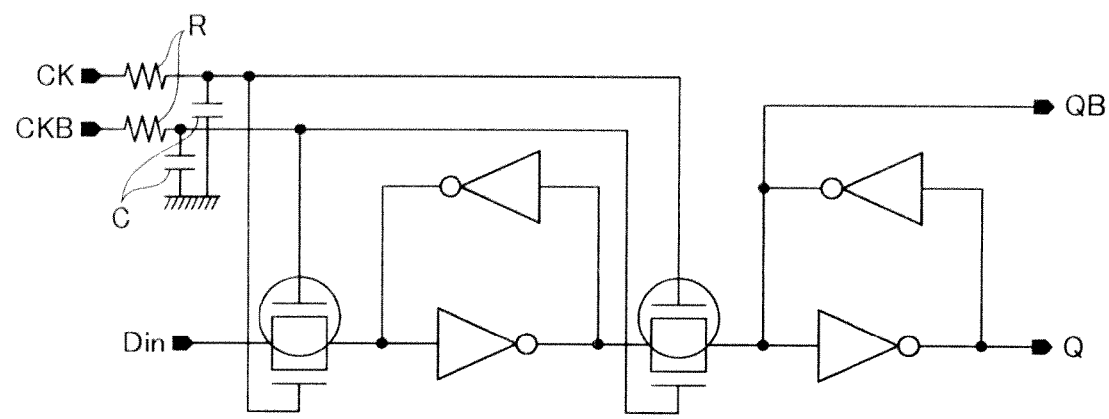
FIG. 38 is a circuit diagram of a circuit block that uses a timing signal CK.

A circuit diagram of a circuit block that uses a timing signal CK is shown in FIG. 38. An example is the write data latch circuit 130 shown in FIG. 9. If the circuit block shown in FIG. 38 is a write data latch circuit 130, the timing signal CK corresponds to the timing signal A. The timing signal CKB is an inverted signal of the timing signal CK. In the example shown in FIG. 38, the lines through which the timing signals CK and CKB are supplied include resistive components R and capacitive components C. The lines have a time constant which is given by $\tau=CR$.

Figure 39:
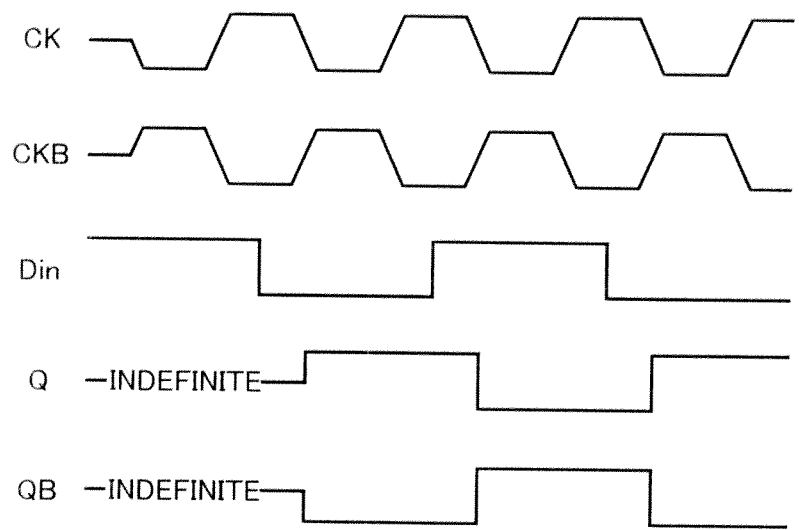
FIG. 39 is an operation waveform chart with a small time constant τ.
Figure 40:
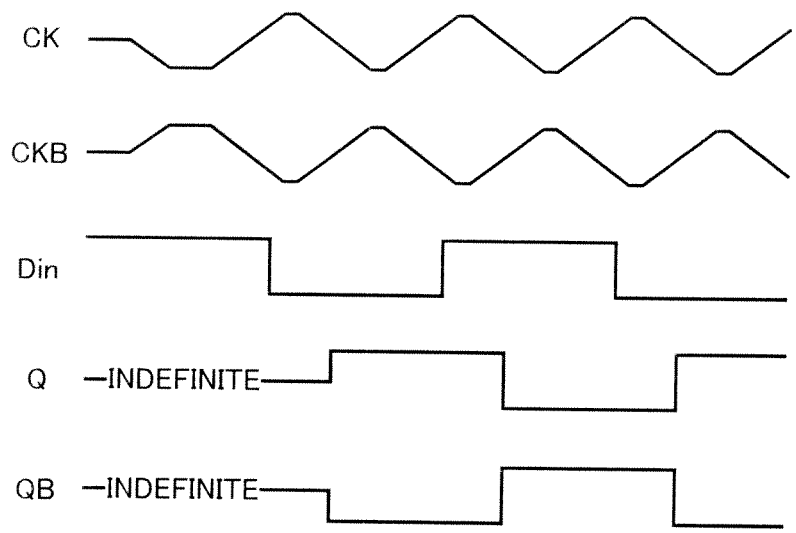
FIG. 40 is an operation waveform chart with a large time constant τ.

As shown in FIG. 39, if the time constant $\tau$ is small, the waveforms of the timing signals CK and CKB are less rounded. Input data Din is thus latched at earlier timing, and output data Q and QB changes earlier. On the other hand, as shown in FIG. 40, if the time constant $\tau$ is large, the waveforms of the timing signals CK and CKB are more rounded. The input data Din is latched at later timing, and the output data Q and QB changes later.

Figure 41:
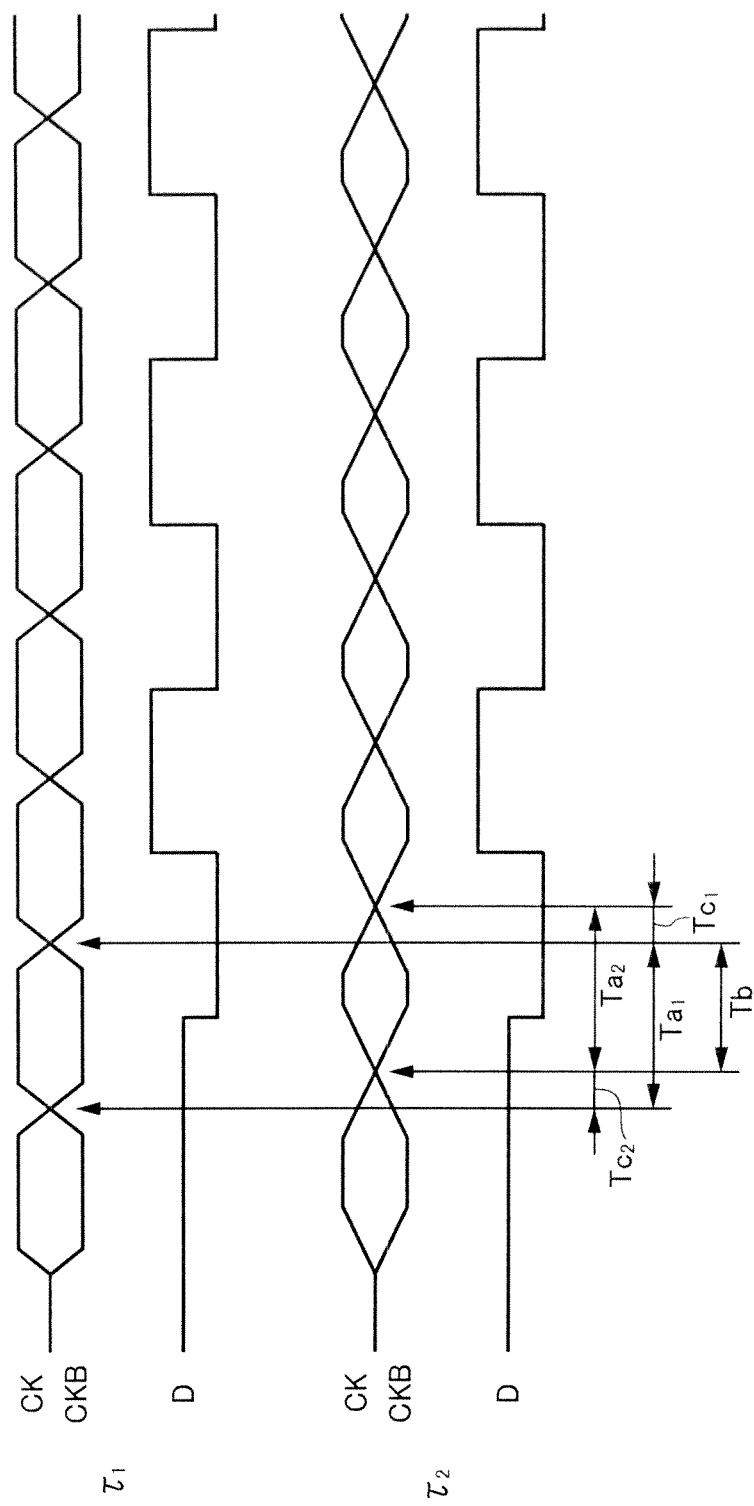
FIG. 41 is a timing chart for explaining the reason why the timing to latch the input data Din changes with the rounding of the waveforms of the timing signals CK and CKB.

Turning to FIG. 41, the waveforms designated by $\tau_1$ are operation waveforms with a small time constant $\tau$. The waveforms designated by $\tau_2$ are operation waveforms with a large time constant $\tau$. That is, $\tau_1<\tau_2$. In the circuit shown in FIG. 38, the input timing of the input data is defined by the interval between the cross points of the timing signals CK and CKB. If the time constant is $\tau_1$, the effective input period for inputting the input data is defined by the period $Ta_1$ shown in FIG. 41. If the time constant is $\tau_2$, the effective input period for inputting the input data is defined by the period $Ta_2$ shown in FIG. 41. The periods $Ta_1$ and $Ta_2$ do not perfectly coincide with each other. In periods where the periods $Ta_1$ and $Ta_2$ do not overlap, some circuit blocks become incapable of latching the input data Din.

Specifically, input data Din that is input in the period $Tc_1$ shown in FIG. 41 is latched into circuit blocks having a time constant of $\tau_2$, whereas the input data Din will not be properly latched into circuit blocks having a time constant of $\tau_1$. Similarly, input data Din that is input in the period $Tc_2$ shown in FIG. 41 is latched into the circuit blocks having a time constant of $\tau_1$, whereas the input data Din will not be properly latched into the circuit blocks having a time constant of $\tau_2$. In order for all circuit blocks operating in parallel to perform a proper latch operation, the input data Din needs to be input in the period Tb shown in FIG. 41. Consequently, when the timing signals CK and CKB have a high frequency and/or a large difference in the time constant, the period Tb becomes so short that it is difficult for all the plurality of circuit blocks operating in parallel to perform a proper latch operation.

Figure 42:
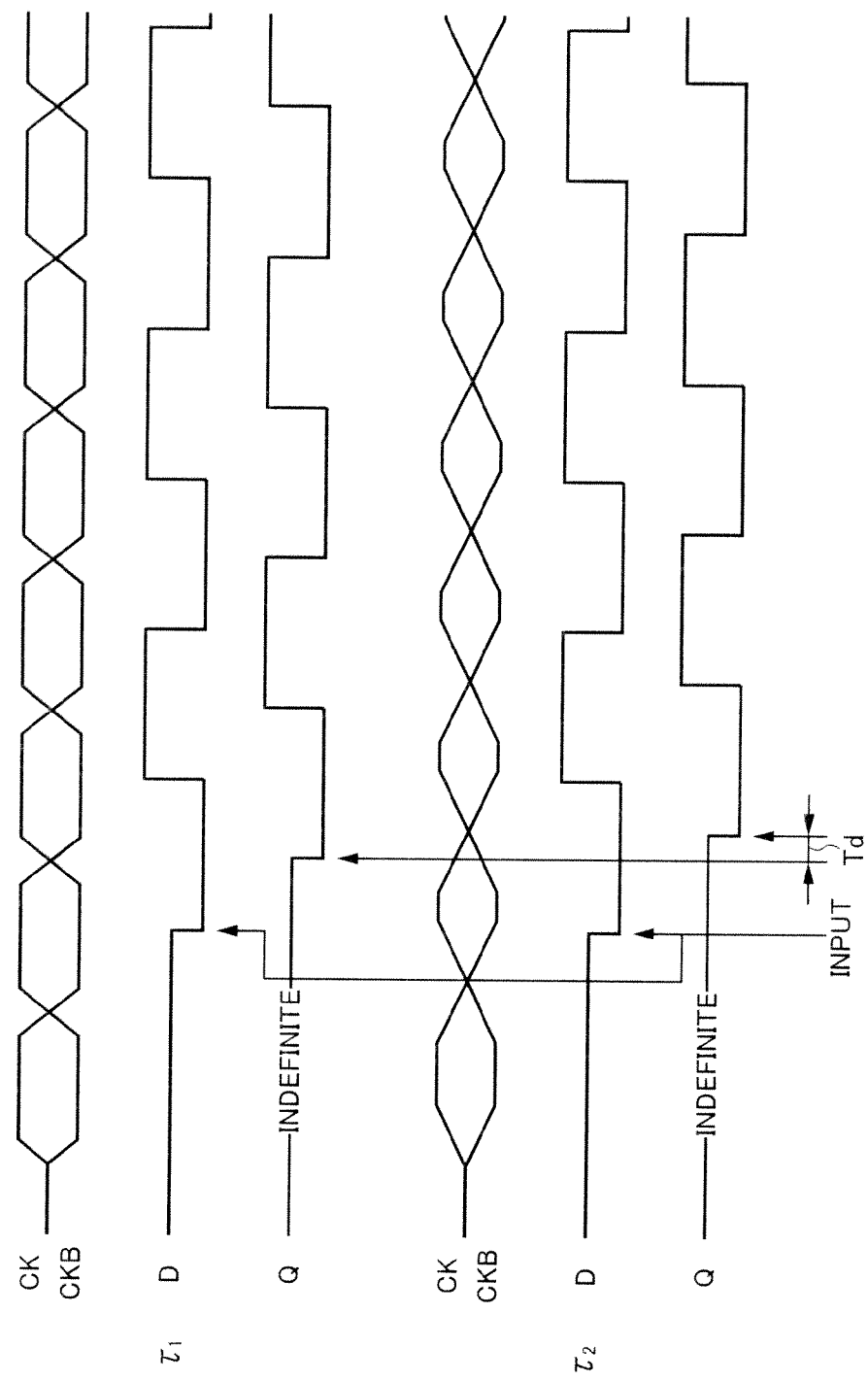
FIG. 42 is a timing chart for explaining the reason why the timing to output the output data Q and QB changes with the rounding of the waveforms of the timing signals CK and CKB.

A timing chart for explaining the reason why the timing to output the output data Q and QB changes with the rounding of the waveforms of the timing signals CK and CKB is shown in FIG. 42. In the circuit shown in FIG. 38, the timing for outputting the output data Q and QB is defined by the cross points of the timing signals CK and CKB. When the time constant is $\tau_2$, the output timing of the output data Q and QB lags by a period Td as compared to when the time constant is $\tau_1$. Circuit blocks in the subsequent stage are designed so that pieces of output data Q and QB with such a time difference can be properly taken in. Design is typically tailored to the slowest timing, which hinders high speed operation.

In contrast to such a prototype, according to the present embodiment, the timing signals A to D having the same waveforms are input to two data input/output circuits 30 adjoining in the Y direction. This prevents the occurrence of the problem described with reference to FIGS. 39 to 42. Note that the input timing of the timing signals A to D to data input/output circuits 30 lying at different positions in the X direction varies slightly, depending on differences in the propagation distances of the timing signals A to D.

FIGS. 43A and 43B are diagrams for explaining the relationship between the positions of write data latch circuits 130 and the input timing of the timing signal A. As shown in FIG. 43A, the data terminals PAD0 and PAD1 are laid out in the closest positions when seen from the source of the timing signal A. The data terminals PAD14 and PAD15 are laid out in the farthest positions when seen from the source of the timing signal A. The data terminal PAD0 and the data terminal PAD1 are in the same position in the X direction. According to the prototype, the distances from the control line CTLA to the corresponding write data latch circuits 130 differ. Consequently, as shown in FIG. 43B, a timing signal a-0 input to the write data latch circuit 130-0 changes at the earliest timing, and a timing signal a-15 input to the write data latch circuit 130-15 changes at the latest timing.

The timing to input write data WDATA2 to the write data latch circuits 130 is defined by the interval between the cross points of the timing signals A and AB. In order for all the write data latch circuits 130-0 to 130-15 to properly latch the write data WDATA2, the input timing of the write data WDATA2 is limited to the period T0. The period T0 is half the cycle of the timing signal A minus a time difference T3 between the timing signal a-0 and the timing signal a-14 and a time difference T2 between the timing signal a-14 and the timing signal a-15. The time difference T1 shown in FIG. 43B is a time difference between the timing signal a-0 and the timing signal a-1.

On the other hand, the semiconductor device 10 according to the present embodiment has an extended period T0. FIGS. 44A and 44B are diagrams for explaining the relationship between the positions of write data latch circuits 130 and the input timing of the timing signal A. As shown in FIG. 44A, in the present embodiment, two write data latch circuits 130 lying in the same position in the X direction are at equal lengths from the control line CTLA. Consequently, as shown in FIG. 44B, the timing signals a-0 and a-1 input to the write data latch circuits 130-0 and 130-1 change at the same timing. Similarly, the timing signals a-14 and a-15 input to the write data latch circuits 130-14 and 130-15 change at the same timing.

In order for all the write data latch circuits 130-0 to 130-15 to properly latch write data WDATA2, the input timing of the write data WDATA2 is limited to the period T4. The period T4 is half the cycle of the timing signal A minus a time difference T3 between the timing signal a-0 or a-1 and the timing signal a-14 or a-15. According to the present embodiment, the latch margin increases as much as a period equivalent to the time difference T1 or T2 as compared to the prototype.

Figure 45:
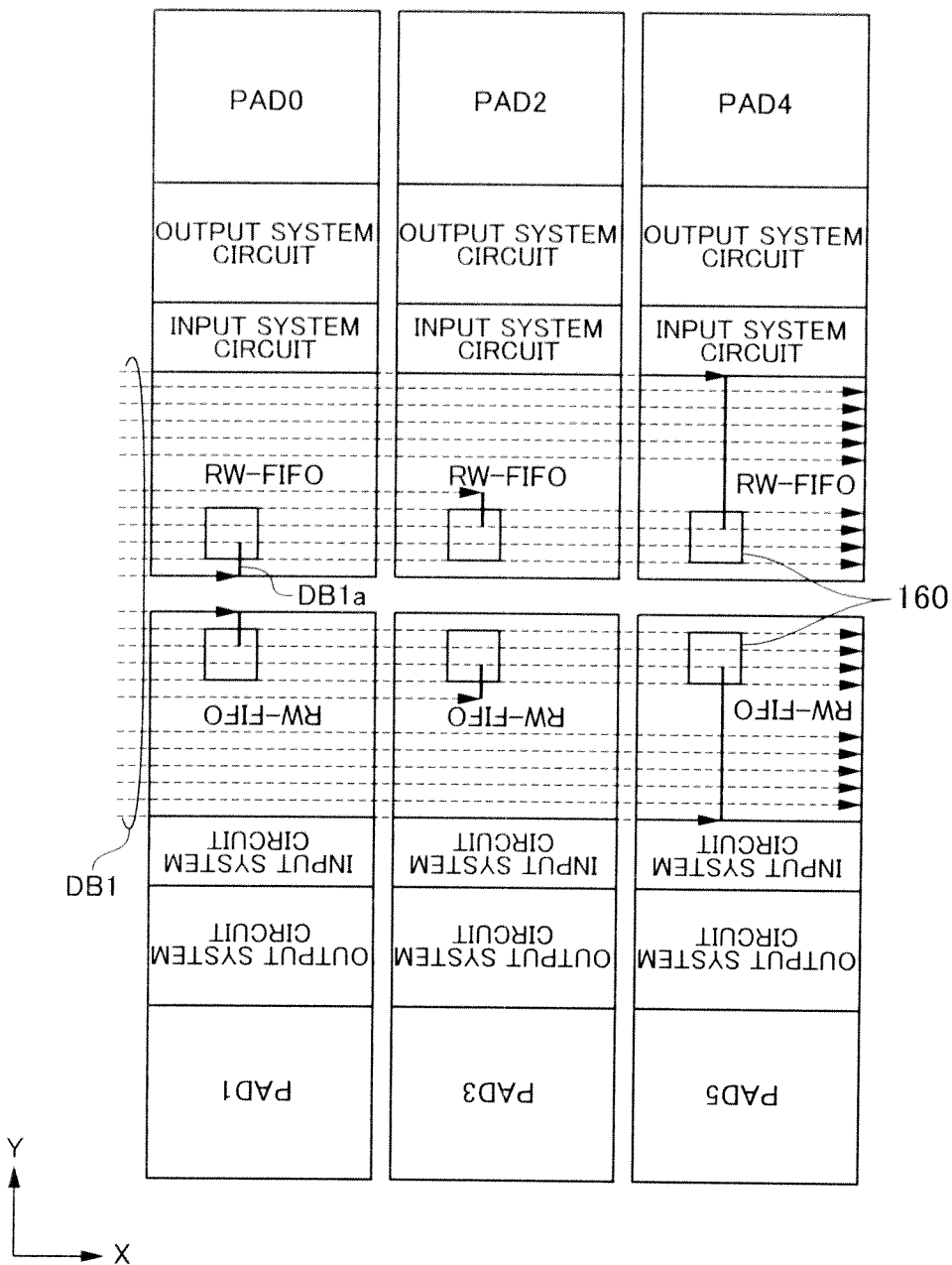
FIG. 45 is a schematic plan view for explaining the positions of write data output buffers 160 according to the prototype.

A schematic plan view for explaining the positions of write data output buffers 160 according to the prototype is shown in FIG. 45. FIG. 45 corresponds to FIG. 30 seen above.

In the prototype, data input/output circuits 30 arranged in the X direction have the same layout, and the write data output buffers 160 are at the same positions in the Y direction. The write data output buffers 160 and the corresponding data buses DB1 therefore need to be connected through data buses DB1a that are bent into the Y direction. The lengths of the data buses DB1a in the Y direction differ from one data input/output circuit 30 to another. The lowest transfer speed results from the data input/output circuits 30 with the longest data buses DB1a. Like the timing signals A to D, design needs to be tailored to the paths of the lowest transfer speed, which leads to a slow transfer TRANS2 from the second section to the third section. In particular, the second section is large in length, and the increased parasitic CR components near the output buffers have a significant impact.

In contrast, as has been described above, the semiconductor device 10 according to the present embodiment is free of such a problem.

Next, modifications of the present invention will be described.

Figure 46:
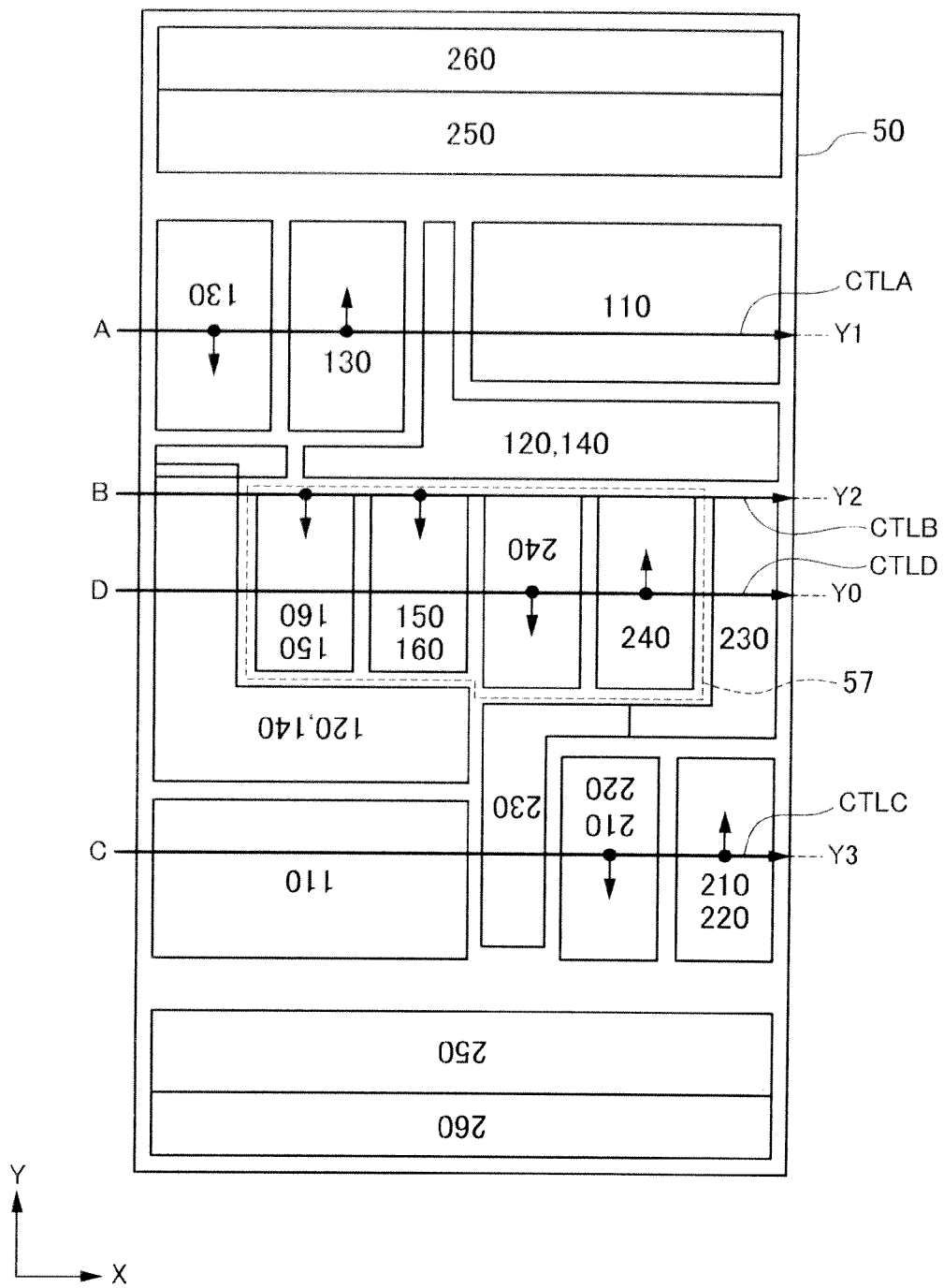
FIG. 46 is a diagram showing a first modification.

Turning to FIG. 46, there is a diagram showing a first modification. FIG. 46 corresponds to FIG. 22 seen above.

FIG. 46 shows two data input/output circuits 30 adjoining in the Y direction according to the modification. As shown in FIG. 46, circuit blocks that use the timing signals A to D are at the same positions in the Y direction. The write data latch circuits 130 using the timing signal A have 180° different layouts in the two data input/output circuits 30, and are arranged so that their intermediate coordinate Y1 coincides with the Y coordinate of the control line CTLA. The same holds for the read data latch circuits 210 and 220 and the output timing adjustment circuits 240 which use the timing signals C and D. Meanwhile, the write data latch circuits 150 using the timing signal B are in the same layout in the two data input/output circuits 30. More specifically, the write data latch circuit 150 included in one of the data input/output circuits 30 and the write data latch circuit 150 included in the other data input/output circuit 30 are in a shift arrangement. Even in FIG. 46, timing can be matched as in FIG. 22. For example, the two write data latch circuits 130 in FIG. 46 are positioned at the same Y coordinate (Y1) which is the same as the Y coordinate (Y1) of the control line CTLA.

Figure 47:
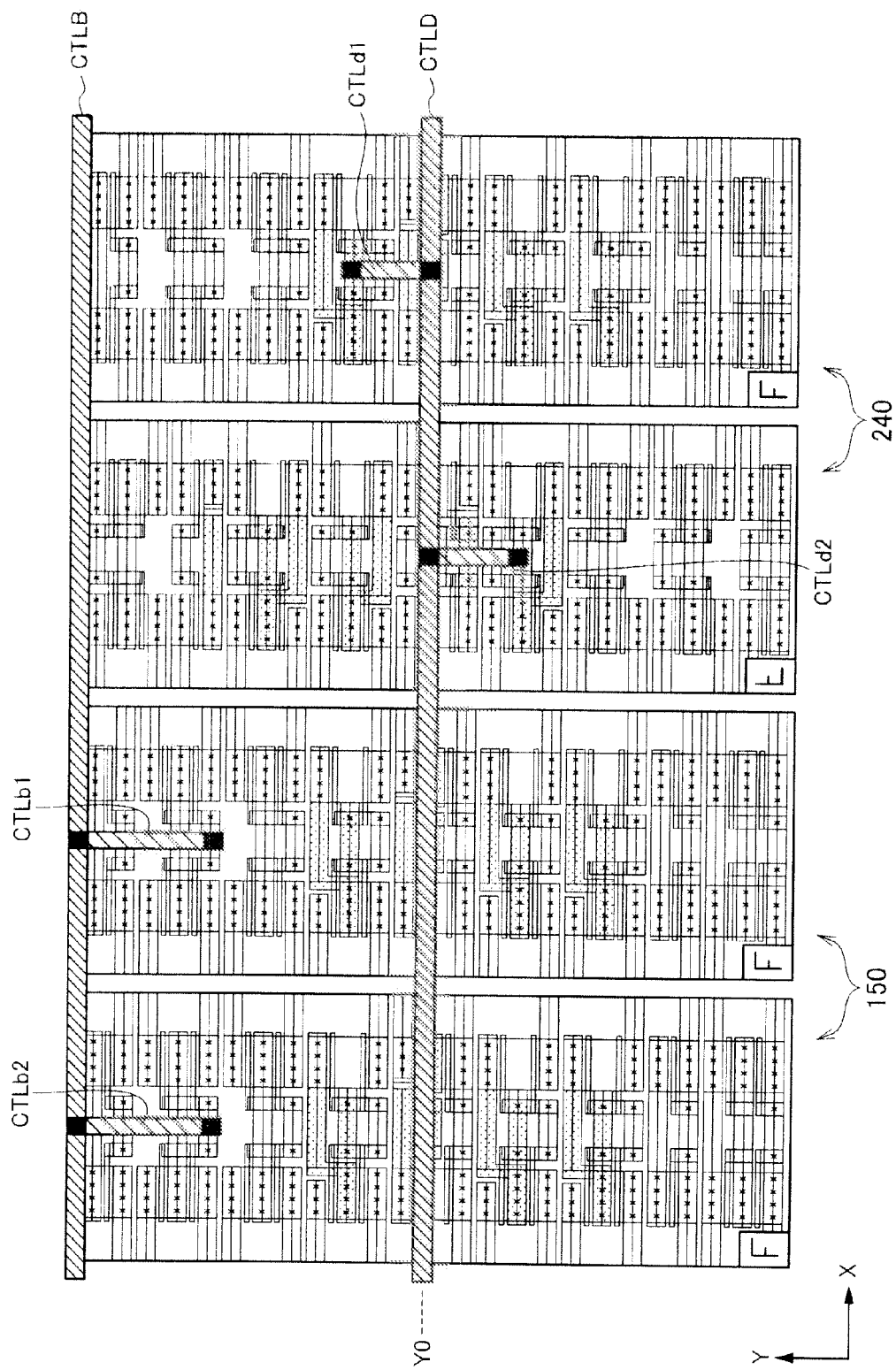
FIG. 47 is a plan view showing the area 57 shown in FIG. 46 in a transistor level.

As shown in FIG. 47, the two write data latch circuits 150 are at the same Y coordinate. The two output timing adjustment circuits 240 are also at the same Y coordinate. As shown by the marks F in FIG. 47, the two write data latch circuits 150 are laid out in the same direction, i.e., in a so-called shift arrangement. On the other hand, the two output timing adjustment circuits 240 are laid out in 180° different directions with the intermediate coordinate Y0 as the axis of symmetry, i.e., in a so-called mirror arrangement.

The control line CTLB which supplies the timing signal B to the write data latch circuits 150 is arranged along one ends of the write data latch circuits 150 in the Y direction. Branch lines CTLb1 and CTLb2 branched from the control line CTLB in the Y direction thus have the same length. Since the write data latch circuits 150 are laid out in a shift arrangement as described above, the position of the control line CTLB in the Y direction is arbitrary. The control line CTLB can be arranged at a coordinate closer to the write data latch circuits 150 to reduce the length of the branch lines CTLb1 and CTLb2.

The control line CTLD which supplies the timing signal D to the output timing adjustment circuits 240 is arranged along the intermediate coordinate Y0 of the output timing adjustment circuits 240. Branch lines CTLd1 and CTLd2 branched from the control line CTLD in the Y direction thus have the same length. Since the output timing adjustment circuits 240 are laid out in a mirror arrangement as described above, the position of the control line CTLD in the Y direction is limited to the intermediate coordinate Y0 of the output timing adjustment circuits 240.

Like the modification described above, according to the present invention, circuit blocks that use the timing signals A to D in two data input/output circuits 30 adjoining in the Y direction may be arranged at the same Y coordinate.

Figure 48:
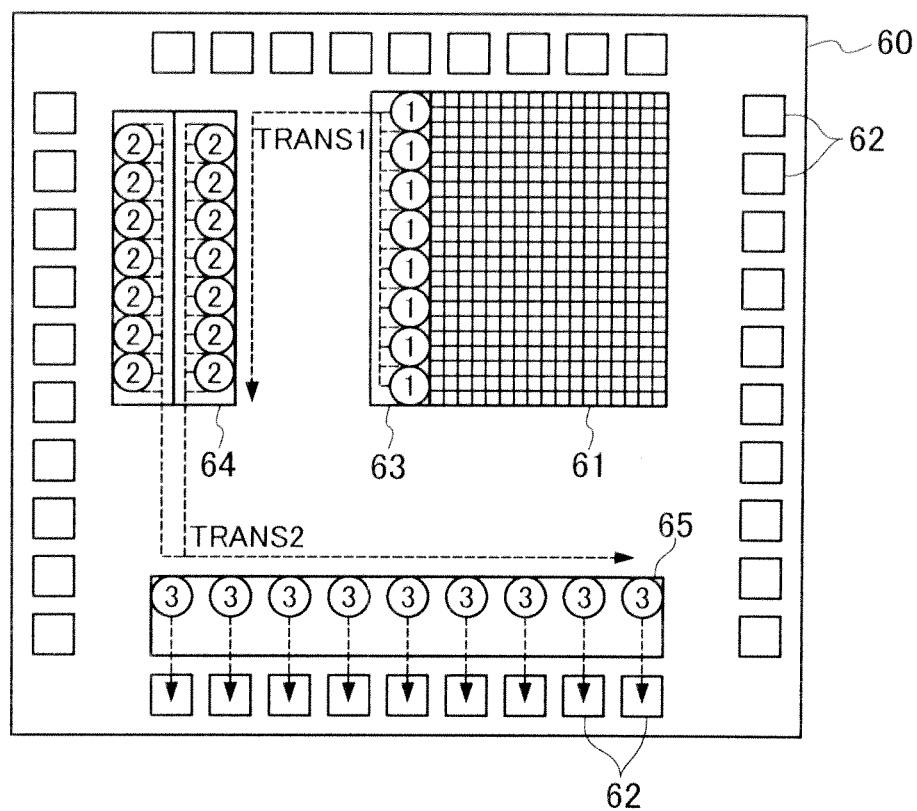
FIG. 48 is a schematic layout diagram showing a semiconductor device 60 according to a second modification.

Turning to FIG. 48, the semiconductor device 60 is an application specific integrated circuit (ASIC) including a memory cell array 61 and a plurality of terminals 62. Data read from the memory cell array 61 is passed through an amplifier circuit 63 (third internal circuit), a control circuit 64 (second internal circuit), and an output circuit 65 (first internal circuit), and output from the plurality of terminals 62 (pads) to outside in parallel. In FIG. 48, latch circuits L11 included in the amplifier circuit 63 are denoted by "1." Latch circuits L12 included in the control circuit 64 are denoted by "2." Latch circuits L13 included in the output circuit 65 are denoted by "3." In the present example, the control circuit 64 has a large circuit scale, and the plurality of latch circuits L12 are difficult to arrange in a row. The plurality of latch circuits L12 are then arranged in two rows in the control circuit 64.

Figure 49:
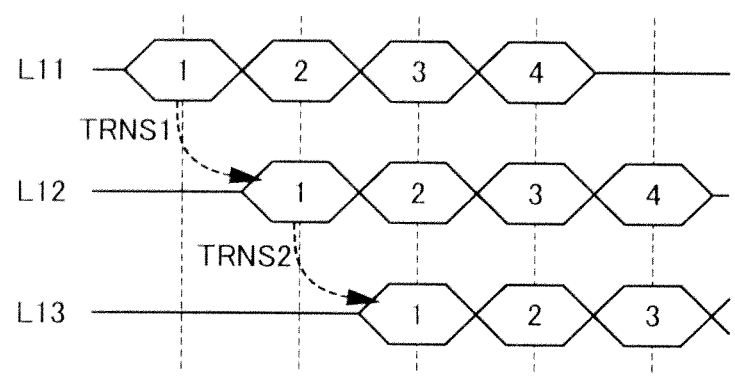
FIG. 49 is a timing chart for explaining the transfer of data in the second modification.

FIG. 49 shows the timing of a transfer TRNS1 from a latch circuit L11 to a latch circuit L12 and a transfer TRNS2 from the latch circuit L12 to a latch circuit L13. Suppose that the transfer TRNS1 from a latch circuit L11 to a latch circuit L12 is an operation of the smallest margin. The present invention can be applied to the internal layout of the control circuit 64 to extend the margin of the transfer TRNS1. More specifically, the plurality of latch circuits L12 arranged in two rows can be laid out so that timing signals are simultaneously input according to the foregoing embodiment or the first modification.

As described above, the present invention may be applied to circuit blocks other than data input/output circuits (in the foregoing example, the control circuit 64).

Figure 50B:
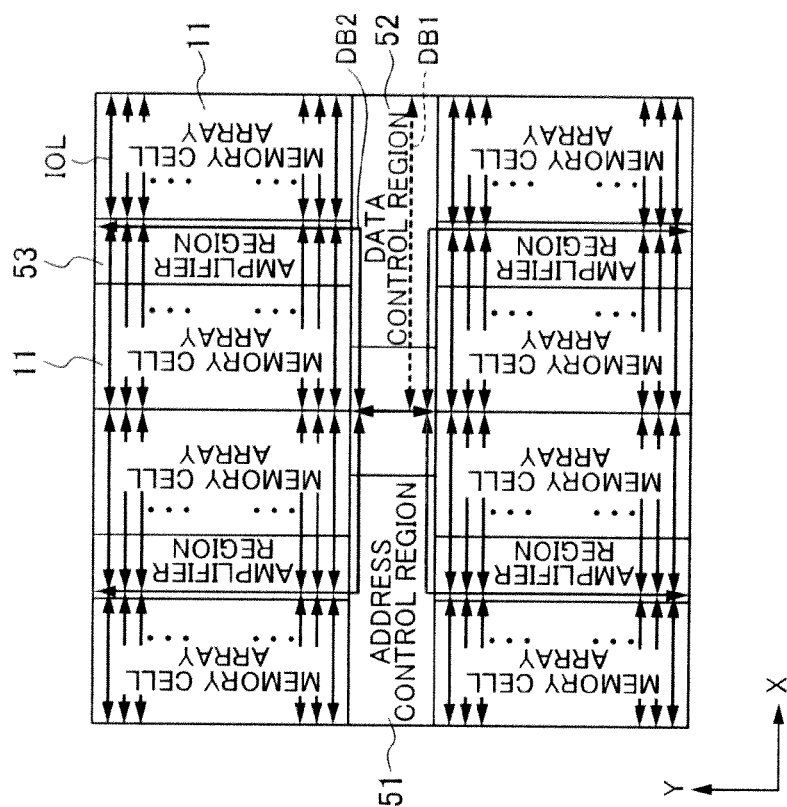
FIGS. 50A and 50B are plan views showing semiconductor devices having layouts different from that of the foregoing embodiment.
Figure 50A:
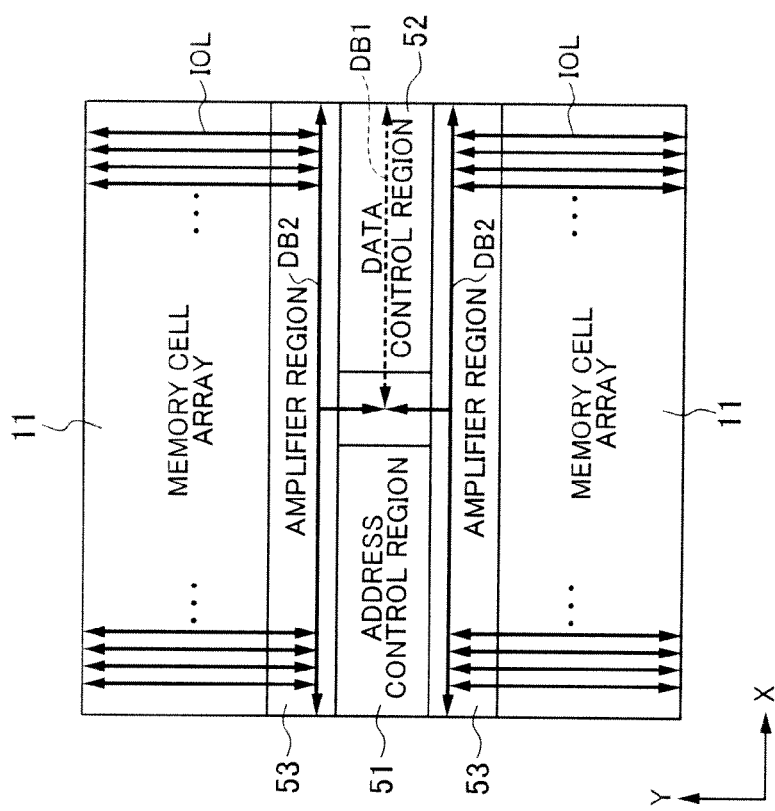

The semiconductor device shown in FIG. 50A includes a memory cell array 11 that is divided into two in the Y direction. Amplifier regions 53, an address control region 51, and a data control region 52 are arranged between the memory cell arrays 11. With such a layout, I/O lines IOL extend in the Y direction and data buses DB2 extend mainly in the X direction. The present invention is applicable to even such a layout if a plurality of data terminals 31 included in the data control region 52 are arranged in two rows.

The semiconductor device shown in FIG. 50B includes a memory cell array 11 that is divided into eight memory cell arrays in a matrix configuration. Amplifier regions 53 are each laid out between two memory cell arrays 11 adjoining in the X direction. The present invention is applicable to even such a layout if a plurality of data terminals 31 included in the data control region 52 are arranged in two rows.

Up to this point, the preferred embodiment of the present invention has been described. However, the present invention is not limited to the foregoing embodiment. It will be understood that various modifications may be made without departing from the gist of the present invention, and such modifications are embraced within the scope of the present invention.

For example, in the foregoing embodiment, the present invention has been described in association with data input/output circuits 30 that handle read data and write data. However, the scope of applications of the present invention is not limited thereto. The present invention may be applied to input circuits to which address data and/or command data is input. In such a case, the "first and second ports" according to the present invention are address terminals or command terminals. The "first and second data lines" are internal address data lines or internal command data lines.

The technical concept of the present invention is applicable to a semiconductor device that includes a signal transmission circuit. The forms of the circuits in the circuit blocks disclosed in the drawings and other circuits for generating the control signals are not limited to the circuit forms disclosed in the embodiment.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors. For example, the present invention can be applied to a general semiconductor device such as a CPU (Central Processing Unit), an MCU (Micro Control Unit), a DSP (Digital Signal Processor), an ASIC (Application Specific Integrated Circuit), and an ASSP (Application Specific Standard Circuit), each of which includes a memory function. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it needles to mention that the present invention embraces the entire disclosure of this specification including the claims, as well as various changes and modifications which can be made by those skilled in the art based on the technical concept of the invention.

What is claimed is:

1. A semiconductor device comprising:
   first and second ports arranged in a first direction;
   first and second data lines extending in a second direction that is substantially orthogonal to the first direction between the first and second ports;
   a first circuit arranged between the first and second ports and including a plurality of sub circuits connected in series between the first port and the first data line, the plurality of sub circuits of the first circuit including at least a first sub circuit;
   a second circuit arranged between the first and second ports and including a plurality of sub circuits connected in series between the second port and the second data line, the plurality of sub circuits of the second circuit including at least a second sub circuit;
   a control line extending in the second direction between the first and second ports and transmitting a timing signal to control the first and second sub circuits in common;
   a first branch line branched from the control line and extending in the first direction to supply the timing signal to the first sub circuit; and
   a second branch line branched from the control line and extending in the first direction to supply the timing signal to the second sub circuit, wherein
   a first coordinate that is an intermediate coordinate between the first and second sub circuits in the first direction is different from a second coordinate that is an intermediate coordinate between the first and second ports in the first direction, and
   the first and second branch lines have substantially the same length in the first direction.

2. The device as claimed in claim 1, wherein the control line is arranged on the first coordinate.

3. The device as claimed in claim 1, wherein the first and second sub circuits have substantially the same coordinates in the second direction.

4. The device as claimed in claim 1, wherein
   the plurality of sub circuits of the first circuit further include a third sub circuit,
   the plurality of sub circuits of the second circuit further include a fourth sub circuit,
   a third coordinate that is an intermediate coordinate between the third and fourth sub circuits in the first direction is different from the second coordinate, and
   the first and second data lines are arranged on the third and fourth sub circuits, respectively.

5. The device as claimed in claim 4, wherein the third and fourth sub circuits are arranged axisymmetrically to each other with respect to the third coordinate.

6. The device as claimed in claim 4, wherein
   at least one of the plurality of sub circuits included in the first circuit excluding the first and third sub circuits and at least one of the plurality of sub circuits included in the second circuit excluding the second and fourth sub circuits are arranged axisymmetrically to each other with respect to the second coordinate.

7. The device as claimed in claim 4, wherein
the first and second ports and the first and second circuits constitute a circuit set,
the device comprises a plurality of the circuit sets arranged in the second direction, and
the control line controls in common the first and second sub circuits included in each of the circuit sets.

8. The device as claimed in claim 7, wherein
a plurality of the first data line and a plurality of the second data line are provided,
each of the plurality of first data lines is coupled to the third sub circuit of an associated one of the circuit sets,
each of the plurality of second data lines is coupled to the fourth sub circuit of an associated one of the circuit sets,
the third coordinates of the circuit sets are different from each other,
each of the first data lines is arranged on an associated one of the third sub circuits, and
each of the second data lines is arranged on an associated one of the fourth sub circuits.

9. The device as claimed in claim 1, wherein the first and second sub circuits are arranged axisymmetrically to each other with respect to the first coordinate.

10. The device as claimed in claim 1, wherein
the first and second ports and the first and second circuits constitute a circuit set,
the device comprises a plurality of the circuit sets arranged in the second direction, and
the control line controls in common the first and second sub circuits included in each of the circuit sets.

11. The device as claimed in claim 1, further comprising a memory cell array that stores storage data, wherein
the storage data are transmitted between the memory cell array and the first and second circuits through the first and second data lines, respectively,
the first circuit outputs the storage data to the first port or receives the storage data from the first port, and
the second circuit outputs the storage data to the second port or receives the storage data from the second port.

12. The device as claimed in claim 11, wherein
the first sub circuit includes at least one of a first data input circuit to which the storage data is supplied from the first port and a first data output circuit that outputs the storage data to the first port, and
the second sub circuit includes at least one of a second data input circuit to which the storage data is supplied from the second port and a second data output circuit that outputs the storage data to the second port.

13. The device as claimed in claim 1, wherein
the first and second ports receive one of an address signal and a command signal to output the one of the address signal and the command signal to the first and second circuits, respectively, and
the first and second data lines transmits the one of the address signal and the command signal supplied from the first and second circuits.

14. The device as claimed in claim 1, further comprising a plurality of pads that communicate with the outside and first to third internal circuits, wherein
the plurality of pads are connected to the first internal circuit,
the second internal circuit includes the first and second ports and the first and second circuits,
the first internal circuit is connected to the first and second ports, and
the second and third internal circuits are connected via the first and second data lines.

15. A semiconductor device comprising:
first and second ports arranged in a first direction;
a first circuit that controls a first signal transmitted through the first port;
a second circuit that controls a second signal transmitted through the second port; and
first and second control lines extending in a second direction substantially orthogonal to the first direction between the first and second ports, wherein
the first circuit includes first and second timing control circuits that control transmission timing of the first signal,
the second circuit includes third and fourth timing control circuits that control transmission timing of the second signal,
the first and third timing control circuits operate in synchronism with a first timing signal supplied through the first control line,
the second and fourth timing control circuits operate in synchronism with a second timing signal supplied through the second control line, and
a first coordinate that is an intermediate coordinate between the first and third timing control circuits in the first direction is different from a second coordinate that is an intermediate coordinate between the second and fourth timing control circuits in the first direction.

16. The device as claimed in claim 15, wherein
distances from the first control line to the first and third timing control circuits in the first direction are substantially the same as each other, and
distances from the second control line to the second and fourth timing control circuits in the first direction are substantially the same as each other.

17. The device as claimed in claim 16, further comprising first and second data lines extending in the second direction between the first and second ports, wherein the first circuit further includes a first sub circuit that inputs or outputs the first signal through the first data line,
the second circuit further includes a second sub circuit that inputs or outputs the second signal through the second data line,
a coordinate of the first data line in the first direction is substantially the same as that of the first sub circuit in the first direction, and
a coordinate of the second data line in the first direction is substantially the same as that of the second sub circuit in the first direction.

18. A semiconductor device comprising:
first and second ports arranged in a first direction;
a first circuit including a first output circuit that outputs a first output data to the first port and a first input circuit that receives a first input data supplied from the first port;
a second circuit including a second output circuit that outputs a second output data to the second port and a second input circuit that receives a second input data supplied from the second port;
a first data line extending in a second direction substantially orthogonal to the first direction between the first and second ports, the first data line transmitting the first input data and the first output data; and
a second data line extending in the second direction between the first and second ports, the second data line transmitting the second input data and the second output data, wherein
the first output circuit, the first input circuit and the first data line are arranged on a first coordinate in the first direction, the second output circuit, the second input circuit and the second data line are arranged on a second coordinate in the first direction, and a coordinate that equally divides the first and second coordinates in the first direction is different from a coordinate that equally divides the first and second ports in the first direction.

19. The device as claimed in claim 18, further comprising first and second control lines extending in the second direction between the first and second ports, wherein the first circuit further includes a first input timing control circuit that controls transmission timing of the first input data and a first output timing control circuit that controls transmission timing of the first output data, the second circuit further includes a second input timing control circuit that controls transmission timing of the second input data and a second output timing control circuit that controls transmission timing of the second output data, the first and second input timing control circuits operate in synchronism with an input timing signal supplied through the first control line, the first and second output timing control circuits operate in synchronism with an output timing signal supplied through the second control line, distances from the first control line to the first and second input timing control circuits in the first direction are substantially the same, and distances from the second control line to the first and second output timing control circuits in the first direction are substantially the same.

20. The device as claimed in claim 19, wherein a first intermediate coordinate between the first and second input timing control circuits in the first direction is different from a second intermediate coordinate between the first and second output timing control circuits in the first direction.

* * * * *